United States Patent
Park et al.

(10) Patent No.: US 9,978,824 B2
(45) Date of Patent: May 22, 2018

(54) ORGANIC LIGHT EMITTING DISPLAY DEVICE

(71) Applicant: Samsung Display Co., Ltd., Yongin-si (KR)

(72) Inventors: Jong-Hyun Park, Cheongju-si (KR); Seong-Kweon Heo, Suwon-si (KR); Young-Rok Song, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days. days.

(21) Appl. No.: 15/356,831

(22) Filed: Nov. 21, 2016

(65) Prior Publication Data

US 2017/0148860 A1 May 25, 2017

(30) Foreign Application Priority Data

Nov. 25, 2015 (KR) .................. 10-2015-0165312

(51) Int. Cl.
*H01L 51/00* (2006.01)
*H01L 27/32* (2006.01)
*H01L 51/52* (2006.01)
*H01L 51/56* (2006.01)

(52) U.S. Cl.
CPC ........ *H01L 27/3262* (2013.01); *H01L 27/326* (2013.01); *H01L 27/3246* (2013.01); *H01L 27/3248* (2013.01); *H01L 27/3258* (2013.01); *H01L 27/3267* (2013.01); *H01L 27/3276* (2013.01); *H01L 51/52* (2013.01); *H01L 51/5203* (2013.01); *H01L 51/5253* (2013.01); *H01L 51/5271* (2013.01); *H01L 51/56* (2013.01); *H01L 2227/323* (2013.01)

(58) Field of Classification Search
CPC ... H01L 27/326; H01L 27/3267; H01L 32/58; H01L 51/52
See application file for complete search history.

(56) References Cited

U.S. PATENT DOCUMENTS

| 9,147,862 | B2 * | 9/2015 | Kim | H01L 51/56 |
| 2005/0264184 | A1 * | 12/2005 | Park | H01L 27/3267 313/504 |
| 2011/0205198 | A1 * | 8/2011 | Jeong | H01L 27/326 345/205 |
| 2012/0097928 | A1 * | 4/2012 | Kim | H01L 27/3267 257/40 |
| 2016/0233282 | A1 * | 8/2016 | Song | H01L 51/56 |

* cited by examiner

*Primary Examiner* — Jamie C Niesz
(74) *Attorney, Agent, or Firm* — H.C. Park & Associates, PLC

(57) ABSTRACT

An organic light emitting display device including a substrate, a first semiconductor element, a first lower electrode, a protection member, a first light emitting layer, a second lower electrode, and a second light emitting layer. The substrate has a first pixel region in which a light is emitted in a first direction, and a second pixel region in which a light is emitted in a second direction that is opposite to the first direction.

18 Claims, 15 Drawing Sheets

FIG. 1
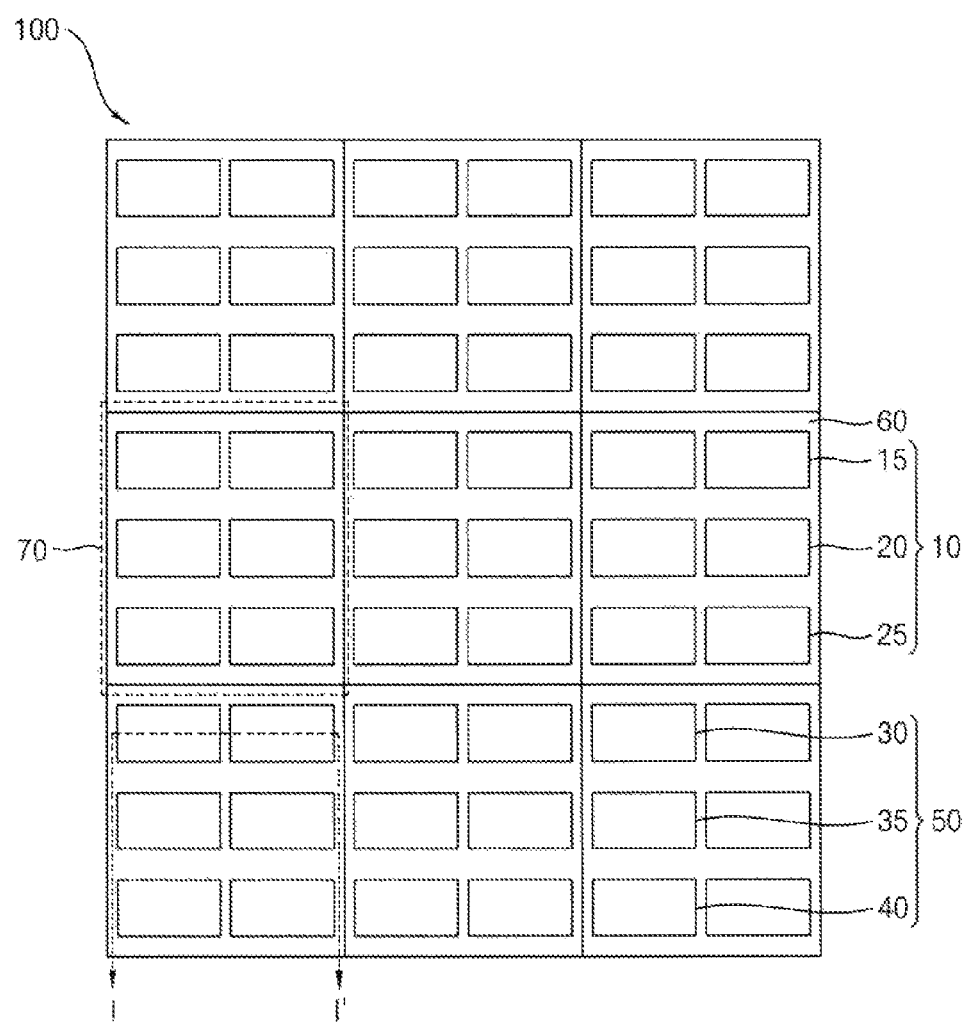
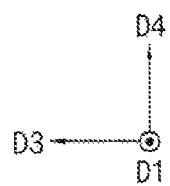

FIG. 2
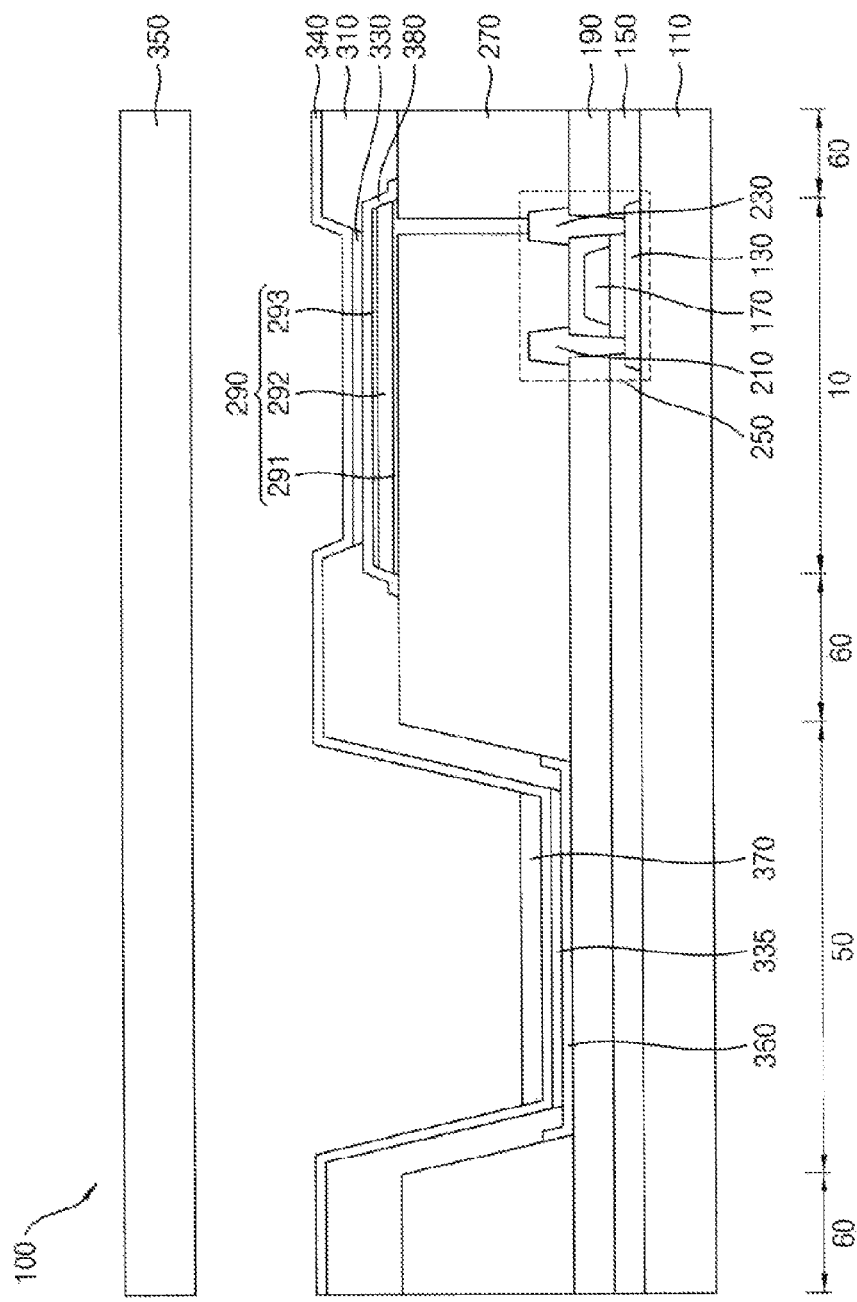
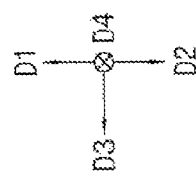

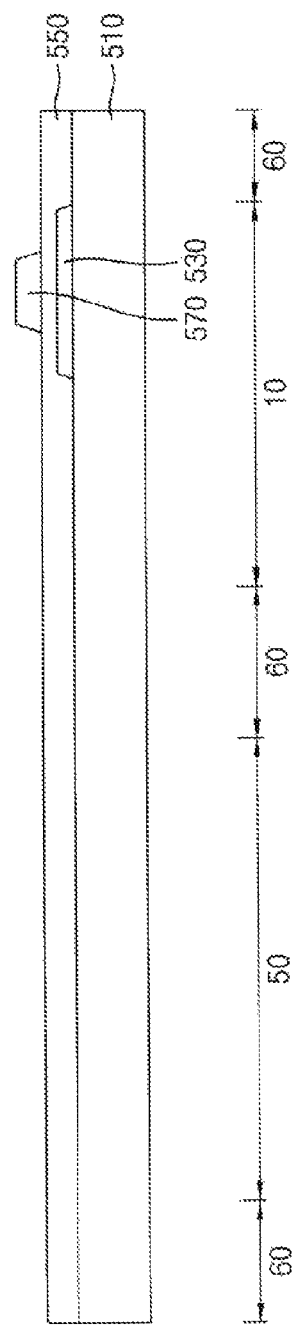
FIG. 5
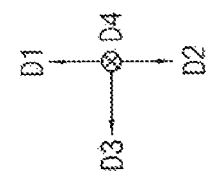

FIG. 6
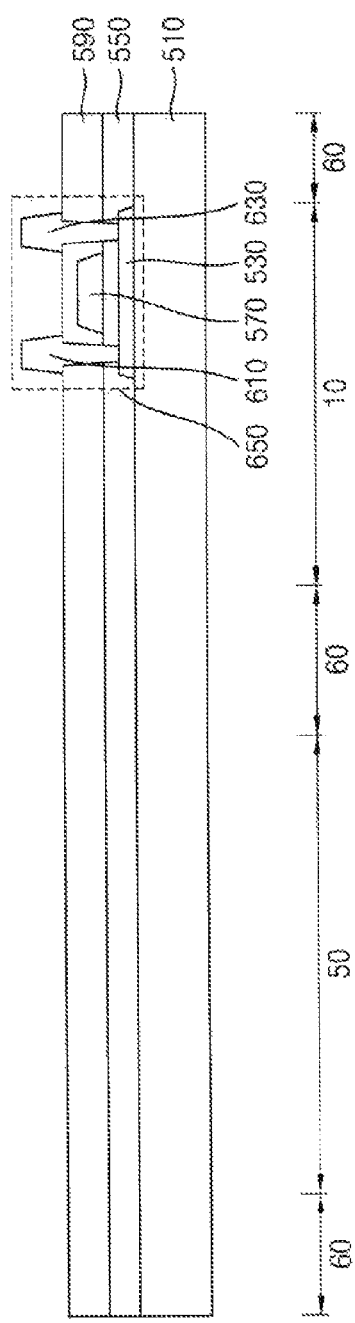
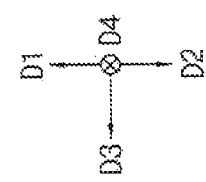

FIG. 7
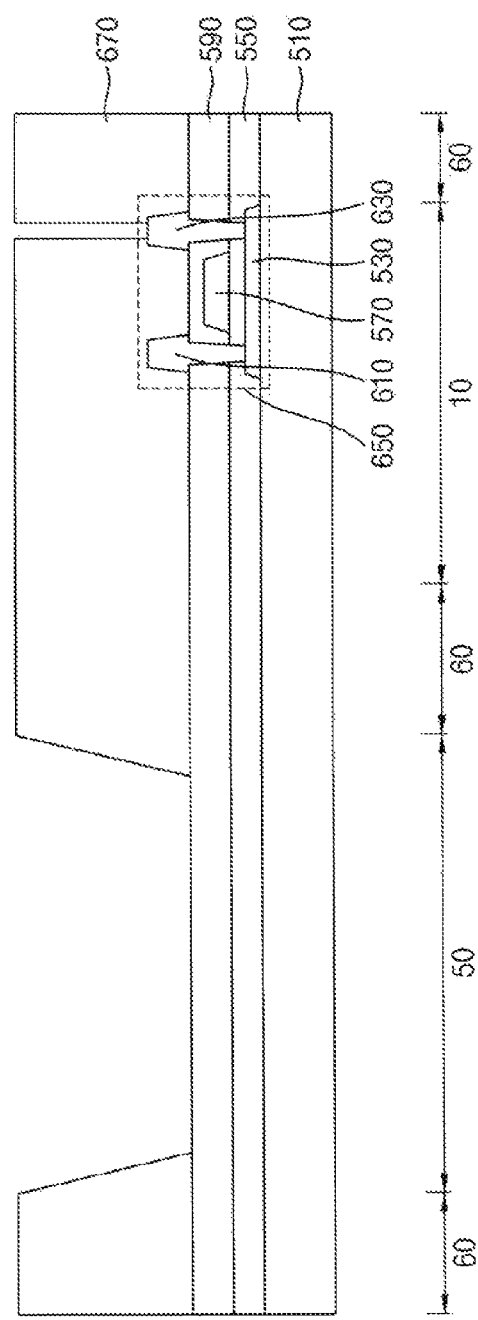
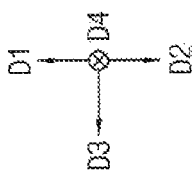

FIG. 9
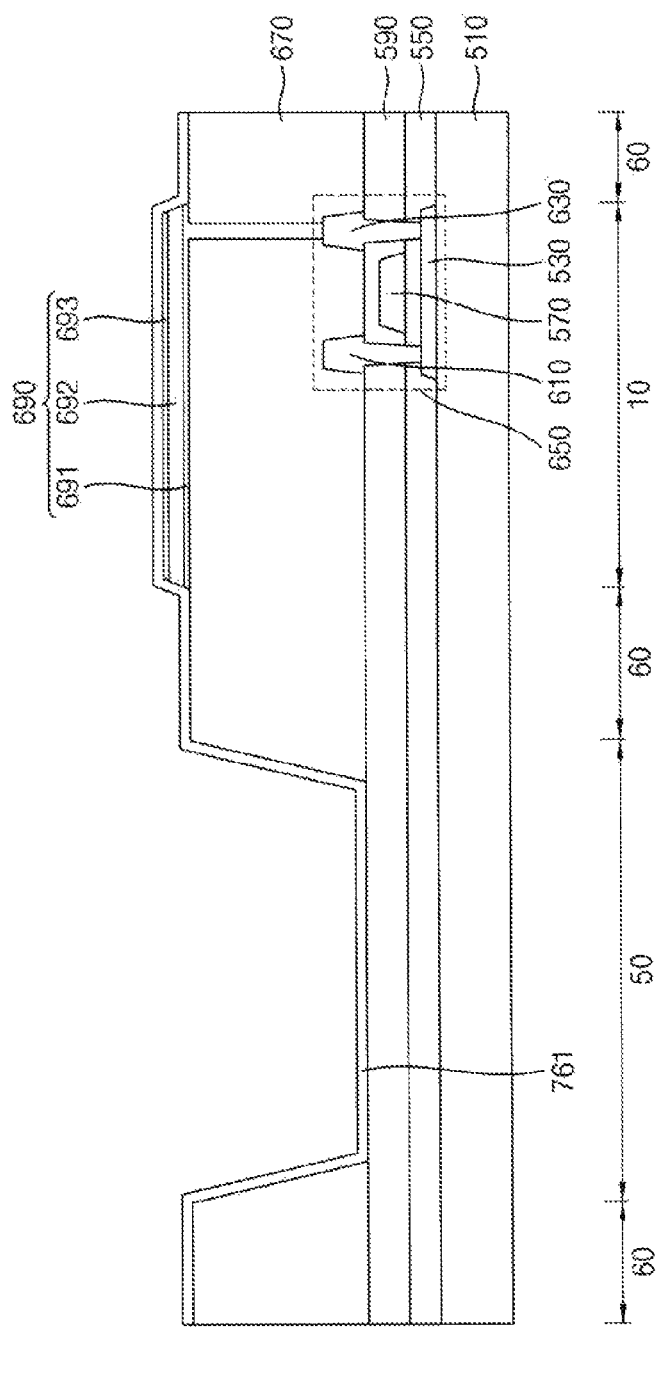
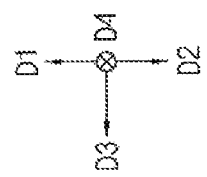

FIG. 11
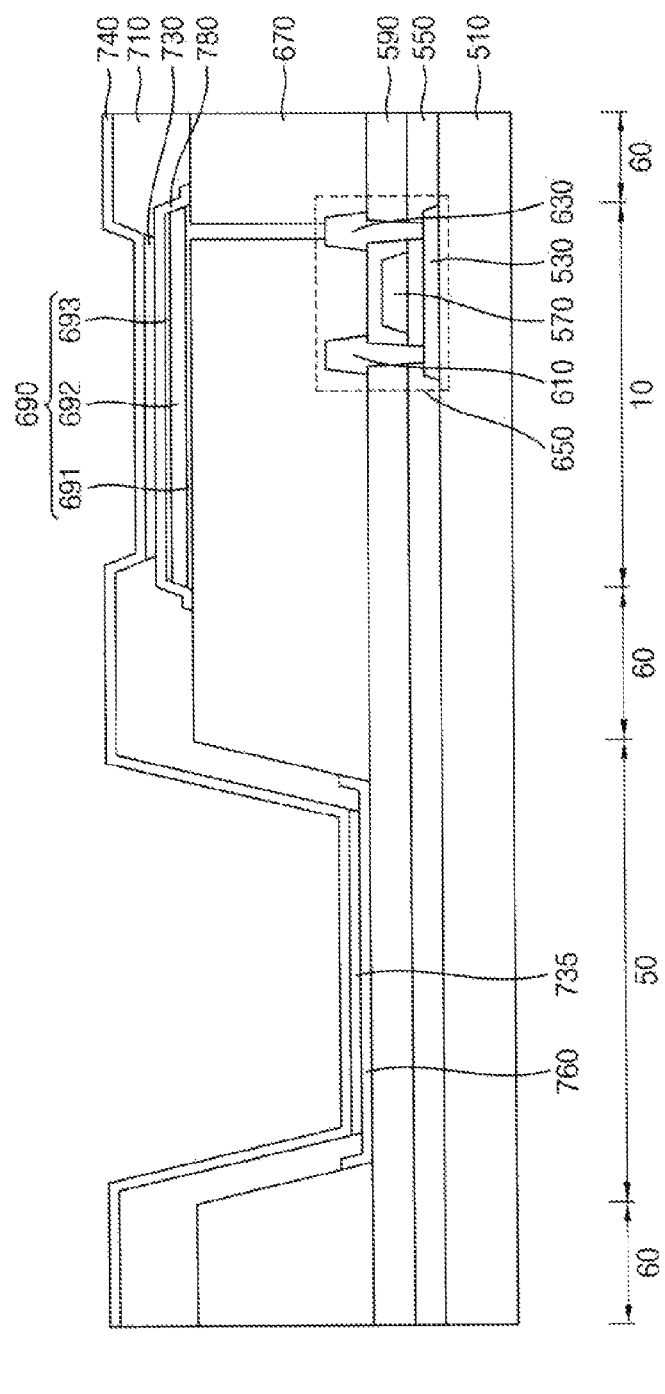
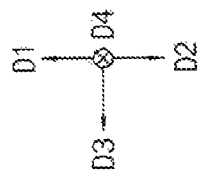

FIG. 13
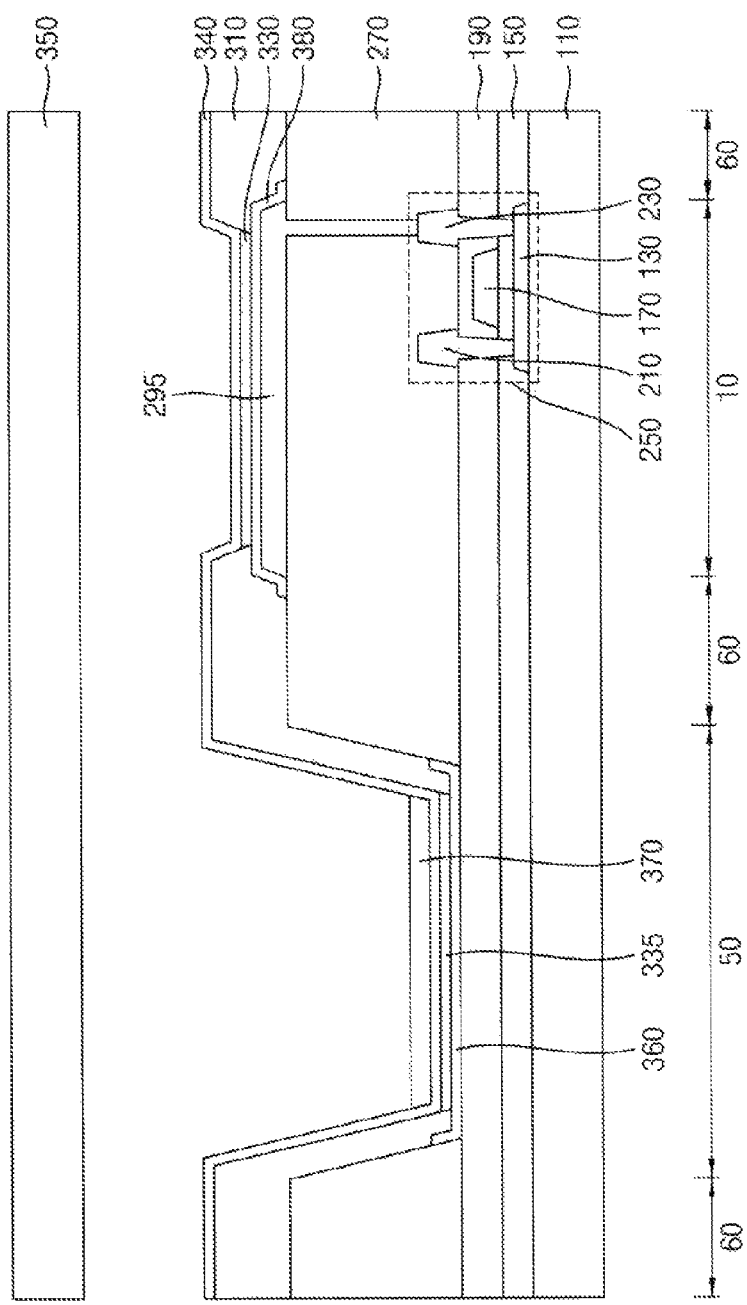
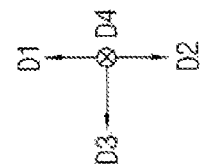

FIG. 16
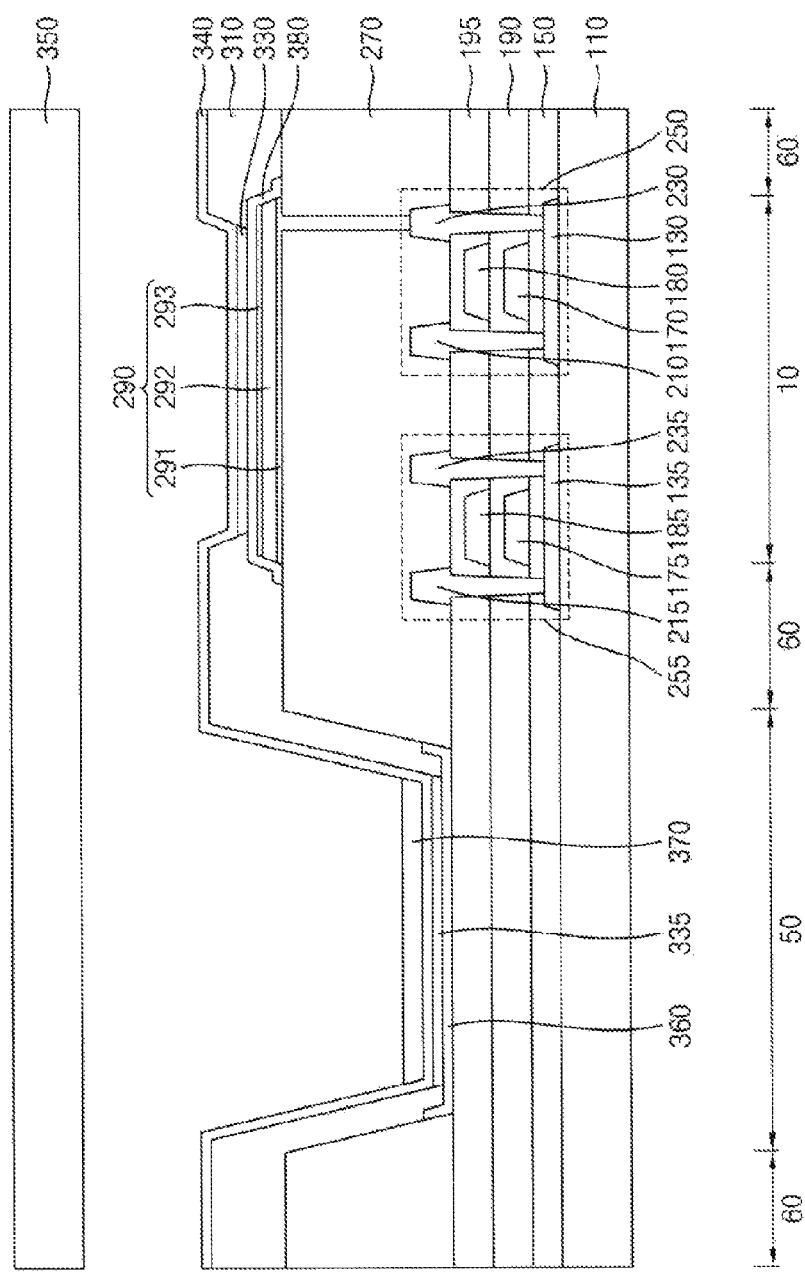
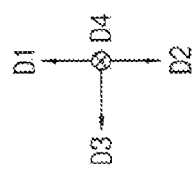

ORGANIC LIGHT EMITTING DISPLAY DEVICE

CROSS-REFERENCE TO RELATED APPLICATION

This application claims priority from and the benefit of Korean Patent Applications No. 10-2015-0165312, filed on Nov. 25, 2015, which is hereby incorporated by reference for all purposes as if fully set forth herein.

BACKGROUND

Field

Exemplary embodiments relate to organic light emitting display devices. More particularly, exemplary embodiments relate to double-sided emission-type organic light-emitting display devices.

Discussion of the Background

A flat panel display (FPD) device is widely used as a display device of an electronic device because the FPD device is lightweight and thin compared to a cathode-ray tube (CRT) display device. Common examples of the FPD device are a liquid crystal display (LCD) device and an organic light emitting (OLED) display device. Compared to the LCD device, the OLED device has many advantages, such as a higher luminance and a wider viewing angle. In addition, the OLED device can be made thinner because the OLED device does not require a backlight. In the OLED device, electrons and holes are injected into an organic thin layer through a cathode and an anode, and then recombined in the organic thin layer to generate excitons, thereby emitting a light of a specific wavelength.

Recently, a double-sided emission-type display device capable of displaying a display image in the front (e.g., top) and the back (e.g., the bottom) of the OLED device by including a top emission region and a bottom emission region has been developed. Here, since the OLED device includes the top emission region and the bottom emission region, the OLED device may include a first lower electrode disposed in the top emission region and a second lower electrode disposed in the bottom emission region. In a process for forming the first lower electrode, the second lower electrode may be damaged due to an etchant etching the first lower electrode. As a result, dark pixels may be generated in the OLED device.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments of the invention provide an organic light emitting display device capable of displaying a display image in the front and the back.

Additional aspects will be set forth in the detailed description which follows, and, in part, will be apparent from the disclosure, or may be learned by practice of the inventive concept.

An exemplary embodiment of the invention discloses an organic light emitting display (OLED) device including a substrate, a first semiconductor element, a first lower electrode, a protection member, a first light emitting layer, a second lower electrode, and a second light emitting layer. The substrate has a first pixel region where a light is emitted in a first direction, and a second pixel region where a light is emitted in a second direction that is opposite to the first direction. The second pixel region is located adjacent to the first pixel region. The first semiconductor element is disposed in the first pixel region on the substrate. The first lower electrode is disposed in the first pixel region on the first semiconductor element, and has a first thickness. The protection member covers the first lower electrode. The first light emitting layer is disposed in the first pixel region on the protection member. The second lower electrode is disposed in the second pixel region on the substrate, and has a second thickness that is less than the first thickness. The second light emitting layer is disposed in the second pixel region on the second lower electrode. The upper electrode is disposed on the first and second light emitting layers.

Because the OLED device according to exemplary embodiments includes the protection member covering the first lower electrode, the OLED device may protect the first lower electrode from an etchant used in a process for forming the second lower electrode. Accordingly, generation of dark pixels may be prevented in the OLED device. In addition, because the second lower electrode includes the transflective electrode layer, the OLED device may have a resonant structure including the second lower electrode and the reflection member.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

FIG. 1 is a planar view illustrating an organic light emitting display (OLED) device in accordance an exemplary embodiment of the invention.

FIG. 2 is a cross-sectional view taken along a line I-I' of FIG. 1.

FIG. 5, FIG. 6, FIG. 7, FIG. 8, FIG. 9, FIG. 10, FIG. 11, and FIG. 12 are cross-sectional views illustrating a method of manufacturing an OLED device in accordance with an exemplary embodiment.

FIG. 13 is a cross-sectional view illustrating an OLED device in accordance with an exemplary embodiment.

FIG. 16 is a cross-sectional view illustrating an OLED device in accordance with an exemplary embodiment.

DETAILED DESCRIPTION OF THE ILLUSTRATED EMBODIMENTS

Figure 3:
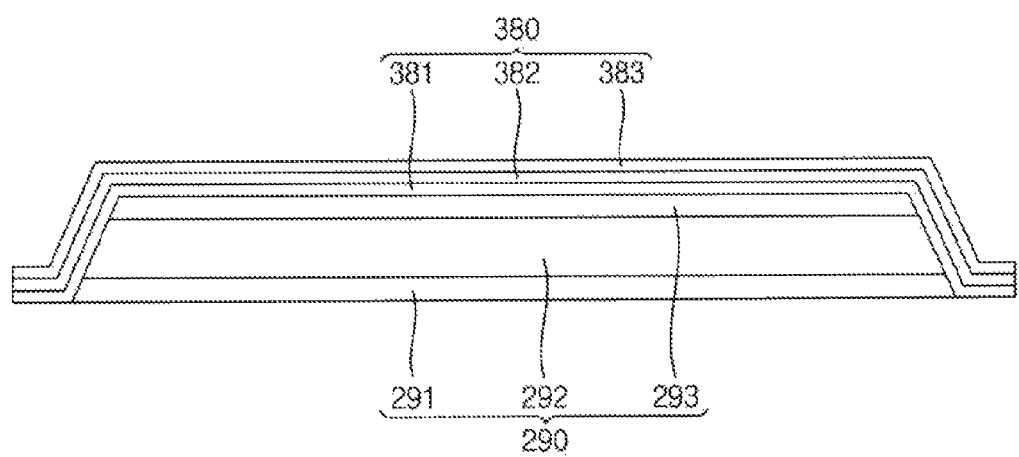
FIG. 3 is a cross-sectional view for describing a first lower electrode and a protection member included in the OLED device of FIG. 2.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a planar view illustrating an organic light emitting display (OLED) device in accordance with an exemplary embodiment.

Referring to FIG. 1, an organic light emitting display (OLED) device 100 may include a plurality of pixel regions 70. One pixel region 70 among a plurality of pixel regions 70 may include a first pixel region 10, a second pixel region 50, and a peripheral region 60. Here, the first pixel region 10 may include first, second, and third sub-pixel regions 15, 20, and 25, arranged in a column direction, and the second pixel region 50 may include fourth, fifth, and sixth sub-pixel regions 30, 35, and 40 in a column direction. In an exemplary embodiment, a light may be emitted through the first pixel region 10 in a first direction D1 (e.g., the front of the OLED device 100) that is perpendicular to an upper surface of a substrate 110, which will be described below, included in the OLED device 100, and a light may be emitted through the second pixel region 50 in a second direction D2 (e.g., the rear of the OLED device 100) that is opposite to the first direction D1.

The pixel regions 70 may be arranged in a third direction D3 (e.g., a direction extending from the first pixel region 10 to the second pixel region 50) that is parallel to the upper surface of the substrate 110, and in a fourth direction D4 that is perpendicular to the third direction D3 on the substrate 110.

As described above, a plurality of second pixel regions 50 each may include the first, second, and third sub-pixel regions 15, 20, and 25, the fourth, fifth, and sixth sub-pixel regions 30, 35, and 40, and the peripheral region 60. The first, second, and third sub-pixel regions 15, 20, and 25 and the fourth, fifth, and sixth sub-pixel regions 30, 35, and 40 may be substantially surrounded by the peripheral region 60. For example, a pixel defining layer, which will be described below, included in the OLED device 100 may be disposed in the peripheral region 60, and the first, second, and third sub-pixel regions 15, 20, and 25 and the fourth, fifth, and sixth sub-pixel regions 30, 35, and 40 may be defined by the pixel defining layer. That is, the pixel defining layer may be disposed in one pixel region 70 except the first, second, and third sub-pixel regions 15, 20, and 25 and the fourth, fifth, and sixth sub-pixel regions 30, 35, and 40.

First, second, and third pixels may be disposed in the first, second, and third sub-pixel regions 15, 20, and 25, respectively. For example, the first sub-pixel may emit a red color of light, and the second sub-pixel may emit a green color of light. In addition, the third sub-pixel may emit a blue color of light. The first through three sub-pixels may be located at the same level on the substrate 110, and may display a display image in the first direction D1.

Fourth, fifth, and sixth sub-pixels may be disposed in the fourth, fifth, and sixth sub-pixel regions 30, 35, and 40, respectively. For example, the fourth sub-pixel may emit a red color of light, and the fifth sub-pixel may emit a green color of light. In addition, the sixth sub-pixel may emit a blue color of light. The fourth through sixth sub-pixels may be located at the same level on the substrate 110, and may display a display image in the second direction D2.

Wirings (e.g., scan wirings, data wirings, power supply wirings, etc) may be disposed in the peripheral region 60. The wirings may be electrically connected to the first through sixth sub-pixels.

Accordingly, the OLED device 100 capable of displaying a display image in the front and back of the OLED device 100 may serve as a double-sided emission-type OLED device.

In exemplary embodiments, the pixel regions 70 are regularly arranged, but the invention is not limited thereto. For example, the pixel regions 70 may be irregularly arranged.

Figure 4:
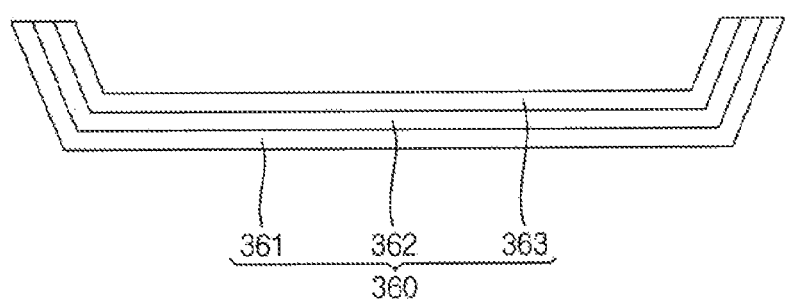
FIG. 4 is a cross-sectional view for describing a second lower electrode included in the OLED device of FIG. 2.

FIG. 2 is a cross-sectional view taken along a line I-I' of FIG. 1, and FIG. 3 is a cross-sectional view for describing a first lower electrode and a protection member included in the OLED device of FIG. 2. FIG. 4 is a cross-sectional view for describing a second lower electrode included in the OLED device of FIG. 2.

Referring to FIGS. 2, 3, and 4, an OLED device 100 may include the substrate 110, a gate insulation layer 150, a first semiconductor element 250, a first insulating interlayer 190, a planarization layer 270, a first lower electrode 290, a protection member 380, a pixel defining layer 310, a second lower electrode 360, a first light emitting layer 330, a second light emitting layer 335, an upper electrode 340, a reflection member 370, and an encapsulation substrate 350. The first semiconductor element 250 may include an active layer 130, a first gate electrode 170, a source electrode 210, and a drain electrode 230. The first lower electrode 290 may include a first transparent electrode layer 291, a reflection electrode layer 292, and a second transparent electrode layer 293, and the second lower electrode 360 may include a third transparent electrode layer 361, a first transflective electrode layer 362, and a fourth transparent electrode layer 363. Further, the protection member 380 may include a fifth transparent electrode layer 381, a second transflective electrode layer 382, and a sixth transparent electrode layer 383. The first lower electrode 290 may have a first thickness, and the second lower electrode 360 may have a second thickness that is less than the first thickness.

As illustrated in FIG. 1, the OLED device 100 may include a plurality of pixel regions 70. One pixel region 70 among the pixel regions 70 may have a first pixel region 10, a second pixel region 50, and a peripheral region 60.

The first semiconductor element 250, the first lower electrode 290, the protection member 380, and the first light emitting layer 330 may be disposed in the first pixel region 10. The second lower electrode 360, the second light emitting layer 335, and the reflection member 370 may be disposed in the second pixel region 50. The upper electrode 340 may be entirely disposed in the first pixel region 10 and the second pixel region 50.

A display image (e.g., a display image corresponding to first, second, and third sub-pixels of FIG. 1) may be displayed in the first pixel region 10 in a first direction D1 that is perpendicular to an upper surface of the substrate 110, and a display image (e.g., a display image corresponding to fourth, fifth, and sixth sub-pixels of FIG. 1) may be displayed in the second pixel region 50 in a second direction D2 that is opposite to the first direction D1. The OLED device 100 may serve as a double-sided emission-type display device.

The substrate 110 may be formed of transparent materials or opaque materials. For example, the substrate 110 may include a quartz substrate, a synthetic quartz substrate, a calcium fluoride substrate, a fluoride-doped quartz substrate, a sodalime glass substrate, a non-alkali glass substrate etc. Alternatively, the substrate 110 may be formed of a flexible transparent material, such as a flexible transparent resin substrate (e.g., a polyimide substrate). For example, the polyimide substrate may include a first polyimide layer, a barrier film layer, a second polyimide layer, etc. Since the polyimide substrate is relatively thin and flexible, the polyimide substrate may be disposed on a rigid glass substrate to help support the formation of a pixel structure (e.g., the first semiconductor element 250, the second lower electrode 360, the second light emitting layer 335, the first lower electrode 290, the protection member 380, the first light emitting layer 330, the upper electrode 340, the reflection member 370, etc). That is, the substrate 110 may have a structure in which the first polyimide layer, the barrier film layer and the second polyimide layer are stacked on the rigid glass substrate. In a method of manufacturing the OLED device 100, after an insulating layer (e.g., a buffer layer) is provided on the second polyimide layer of the polyimide substrate, the pixel structure may be disposed on the insulating layer. After the pixel structure is formed on the insulating layer, the rigid glass substrate on which the polyimide substrate is disposed may be removed. It may be difficult to directly form the pixel structure on the polyimide substrate because the polyimide substrate is relatively thin and flexible. Accordingly, the pixel structure is formed on the polyimide substrate and the rigid glass substrate, and then the polyimide substrate may serve as the substrate 110 of the OLED device 100 after the removal of the rigid glass substrate. Because the OLED device 100 includes the first pixel region 10, the second pixel region 50, and the peripheral region 60, the substrate 110 may also include the first pixel region 10, the second pixel region 50, and the peripheral region 60.

A buffer layer (not shown) may be disposed on the substrate 110. The buffer layer may be disposed on the entire substrate 110. The buffer layer may prevent the diffusion of metal atoms and/or impurities from the substrate 110 into the first semiconductor element 250. Additionally, the buffer layer may control the rate of a heat transfer in a crystallization process for forming the active layer 130, thereby obtaining a substantially uniform active layer. Furthermore, the buffer layer may improve a surface flatness of the substrate 110 when a surface of the substrate 110 is relatively uneven. According to the type of the substrate 110, at least two buffer layers may be provided on the substrate 110, or the buffer layer may be omitted. For example, the buffer layer may include organic materials or inorganic materials.

The first semiconductor element 250 may include the active layer 130, the first gate electrode 170, the source electrode 210, and the drain electrode 230. The first semiconductor element 250 may be disposed in the first pixel region 10 on the substrate 110.

The active layer 130 may be disposed in the first pixel region 10 on the substrate 110. For example, the active layer 130 may include an oxide semiconductor, an inorganic semiconductor (e.g., amorphous silicon, polysilicon, etc.), an organic semiconductor, etc.

The gate insulation layer 150 may be disposed on the active layer 130. The gate insulation layer 150 may extend in a third direction D3 on the substrate 110. Here, the third direction D3 may be parallel to an upper surface of the substrate 110, or may extend from the first pixel region 10 to the second pixel region 50. The gate insulation layer 150 may cover the active layer 130 in the first pixel region 10, and may be disposed on the entire substrate 110. For example, the gate insulation layer 150 may cover the active layer 130, and may have a substantially even surface without a step around the active layer 130. Alternatively, the gate insulation layer 150 may cover the active layer 130, and may be disposed as a substantially uniform thickness along a profile of the active layer 130. The gate insulation layer 150 may include a silicon compound, a metal oxide, etc. For example, the gate insulation layer 150 may include silicon oxide ($SiO_x$), silicon nitride ($SiN_x$), silicon oxynitride ($SiO_xN_y$), silicon oxycarbide ($SiO_xC_y$), silicon carbon nitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), etc.

The first gate electrode 170 may be disposed on the gate insulation layer 150. The first gate electrode 170 may be located on a portion of the gate insulation layer 150 under which the active layer 130 is disposed to overlap the active layer 130 in a planar view. The first gate electrode 170 may include a metal, a metal alloy, metal nitride, conductive metal oxide, transparent conductive materials, etc. For example, the first gate electrode 170 may include gold (Au), silver (Ag), aluminum (Al), an alloy of aluminum, aluminum nitride ($AlN_x$), silver (Ag), an alloy of silver, tungsten (W), tungsten nitride ($WN_x$), copper (Cu), an alloy of copper, nickel (Ni), chrome (Cr), chrome nitride ($CrN_x$), molybdenum (Mo), an alloy of molybdenum, titanium (Ti), titanium nitride ($TiN_x$), platinum (Pt), tantalum (Ta), tantalum nitride ($TaN_x$), neodymium (Nd), scandium (Sc), strontium ruthenium oxide (SRO), zinc oxide ($ZnO_x$), stannum oxide ($SnO_x$), indium oxide ($InO_x$), gallium oxide ($GaO_x$), indium tin oxide (ITO), indium zinc oxide (IZO), etc. These may be used alone or in a suitable combination thereof.

The first insulating interlayer 190 may be disposed on the first gate electrode 170. The first insulating interlayer 190 may cover the first gate electrode 170 in the first pixel region 10, and may extend in the third direction D3 on the gate insulation layer 150. That is, the first insulating interlayer 190 may be disposed on the entire substrate 110. For example, the first insulating interlayer 190 may cover the first gate electrode 170, and may have a substantially even surface without a step around the first gate electrode 170. Alternatively, the first insulating interlayer 190 may cover the first gate electrode 170, and may be disposed as a substantially uniform thickness along a profile of the first gate electrode 170. The first insulating interlayer 190 may include a silicon compound, a metal oxide, etc.

The source electrode 210 and the drain electrode 230 may be disposed on the first insulating interlayer 190. The source electrode 210 may be in contact with a first side of the active layer 130 via a contact hole formed by removing a portion of the gate insulation layer 150 and the first insulating interlayer 190 each. The drain electrode 230 may be in contact with a second side of the active layer 130 via a contact hole formed by removing a portion of the gate insulation layer 150 and the first insulating interlayer 190 each. Accordingly, the first semiconductor element 250 including the active layer 130, the first gate electrode 170, the source electrode 210, and the drain electrode 230 may be disposed. Each of the source electrode 210 and the drain electrode 230 may include a metal, a metal alloy, metal nitride, conductive metal oxide, transparent conductive materials, etc.

The planarization layer 270 may be disposed on the source electrode 210 and the drain electrode 230. The planarization layer 270 may extend in the third direction D3 on the first insulating interlayer 190, and may have a first opening exposing a portion of the first insulating interlayer 190 in the second pixel region 50. For example, the planarization layer 270 may be disposed with a relatively large thickness to cover the source and drain electrodes 210 and 230. In this case, the planarization layer 270 may have a substantially even upper surface, and a planarization process may be further performed on the planarization layer 270 to implement the even upper surface of the planarization layer 270. Alternatively, the planarization layer 270 may cover the source and drain electrodes 210 and 230, and may be disposed as a substantially uniform thickness along a profile of the source and drain electrodes 210 and 230. The planarization layer 270 may include organic materials or inorganic materials. In an exemplary embodiment, the planarization layer 270 may include organic materials. For example, the planarization layer 270 may include a photoresist, a polyacryl-based resin, a polyimide-based resin, a polyamide-based resin, a siloxane-based resin, an acryl-based resin, an epoxy-based resin, etc.

The first lower electrode 290 may be disposed in the first pixel region 10 on the planarization layer 270, and may have the first thickness that is greater than the second thickness of the second lower electrode 360. The first lower electrode 290 may be in contact with the drain electrode 230 by perforating a contact hole of the planarization layer 270. In addition, the first lower electrode 290 may be electrically connected to the first semiconductor element 250. The OLED device 100 in the first pixel region 10 may display a display image in the first direction D1. For example, the OLED device 100 may be manufactured as a top emission structure in the first pixel region 10. Thus, the first lower electrode 290 may include a light reflection layer. For example, as illustrated in FIG. 3, the first lower electrode 290 may have a multi-layered structure. The multi-layered structure may include the first transparent electrode layer 291, the reflection electrode layer 292, and the second transparent electrode layer 293. The first transparent electrode layer 291 may be disposed in the first pixel region 10 on the planarization layer 270, and the reflection electrode layer 292 and the second transparent electrode layer 293 may be sequentially disposed on the first transparent electrode layer 291. Here, the first transparent electrode layer 291 and the second transparent electrode layer 293 may include substantially the same material, and the reflection electrode layer 292 may be interposed between the first transparent electrode layer 291 and the second transparent electrode layer 293. A thickness of the first and second transparent electrode layers 291 and 293 each may be substantially less than that of the reflection electrode layer 292, and a thickness of the first transparent electrode layer 291 may be substantially the same as that of the second transparent electrode layer 293.

The first transparent electrode layer 291 may cover an uneven upper surface of the planarization layer 270. As the first transparent electrode layer 291 is disposed on the planarization layer 270, the first transparent electrode layer 291 may help the formation of the reflection electrode layer 292. As the second transparent electrode layer 293 is disposed on the reflection electrode layer 292, a color coordinate of the OLED device 100 may be readily controlled. The reflection electrode layer 292 may serve as the light reflection layer. The reflection electrode layer 292 may reflect a light emitted from the first light emitting layer 330 in the front (e.g., the first direction D1) of the OLED device 100. Thus, the first lower electrode 290, including the reflection electrode layer 292, may be substantially opaque. Alternatively, the first lower electrode 290 may have a multi-layered structure including the first transparent electrode layer 291 and the reflection electrode layer 292, or may have a single layer structure including the reflection electrode layer 292. For example, the reflection electrode layer 292 may include a metal, a metal alloy, metal nitride, conductive metal oxide, transparent conductive materials, etc. Each of the first transparent electrode layer 291 and the second transparent electrode layer 293 may be substantially transparent. Each of the first transparent electrode layer 291 and the second transparent electrode layer 293 may include transparent conductive materials, etc.

Referring to FIGS. 2 and 4, the second lower electrode 360 may be disposed in the second pixel region 50 on the first insulating interlayer 190. For example, the second lower electrode 360 may be disposed in the first opening of the planarization layer 270, and the second lower electrode 360, the source electrode 210, and the drain electrode 230 may be located at the same level. A thickness of the second lower electrode 360 may be less than that of the first lower electrode 290. For example, the second lower electrode 360 may have a small thickness such that a light emitted from second light emitting layer 335 is transmitted in the second direction D2. In an exemplary embodiment, the second lower electrode 360 may have a multi-layered structure. For example, as illustrated in FIG. 4, the second lower electrode 360 may include the third transparent electrode layer 361, the first transflective electrode layer 362, and the fourth transparent electrode layer 363. The third transparent electrode layer 361 may be disposed in the second pixel region 50 on the first insulating interlayer 190, and the first transflective electrode layer 362 and the fourth transparent electrode layer 363 may be sequentially disposed on the third transparent electrode layer 361. Here, the third transparent electrode layer 361 and the fourth transparent electrode layer 363 may be made of the same materials, and the first transflective electrode layer 362 may be interposed between the third transparent electrode layer 361 and the fourth transparent electrode layer 363.

The third transparent electrode layer 361 may cover an uneven upper surface of the first insulating interlayer 190. Because the third transparent electrode layer 361 is disposed on the first insulating interlayer 190, the third transparent electrode layer 361 may assist in the formation of the first transflective electrode layer 362. The third transparent electrode layer 361 may be substantially transparent, and may transmit a light emitted from the second light emitting layer 335. Because the first transflective electrode layer 362 is disposed on the third transparent electrode layer 361, the OLED device 100 may have a resonant structure in the second pixel region 50. For example, the first transflective electrode layer 362 may reflect at least a portion of a light emitted from the second light emitting layer 335 in the first direction D1. That is, the first transflective electrode layer 362 capable of transmitting a portion of a light and reflecting a remaining portion of a light may serve as a transflective layer. A light reflected from the first transflective electrode layer 362 may be reflected from the reflection member 370. In this way, a light emitted from the second light emitting layer 335 may be resonated between the first transflective electrode layer 362 and the fourth transparent electrode layer 363. The fourth transparent electrode layer 363 may be substantially transparent, and may transmit a light emitted from the second light emitting layer 335. Because the fourth transparent electrode layer 363 is disposed on the first transflective electrode layer 362, a color coordinate of the OLED device 100 may be readily controlled. Alternatively, the third transparent electrode layer 361 may control a color coordinate of the OLED device 100. The first transflective electrode layer 362 may include a metal, a metal alloy, metal nitride, conductive metal oxide, etc. Each of the third transparent electrode layer 361 and the fourth transparent electrode layer 363 may include transparent conductive materials, etc.

The protection member 380 may be disposed on the first lower electrode 290 and a portion of the planarization layer 270. In an exemplary embodiment, the protection member 380 may completely surround the first lower electrode 290 such that the first lower electrode 290 is not exposed. For example, a lower surface of the first lower electrode 290 may be in direct contact with an upper surface of the planarization layer 270, and an upper surface of the first lower electrode 290 may be in direct contact with a lower surface of the protection member 380. In addition, a portion of the protection member 380 may be in direct contact with an upper surface of the planarization layer 270. Because the protection member 380 completely covers the first lower electrode 290, the protection member 380 may protect the first lower electrode 290 from an etchant used in a process for forming the second lower electrode 360. In an exemplary embodiment, the protection member 380 and the second lower electrode 360 may be simultaneously (or concurrently) formed using the same material. Alternatively, the protection member 380 and the second lower electrode 360 may be made of different materials, and formation of the protection member 380 and the second lower electrode 360 may not be simultaneous.

As illustrated in FIG. 3, the protection member 380 may include the fifth transparent electrode layer 381, the second transflective electrode layer 382, and the sixth transparent electrode layer 383. The fifth transparent electrode layer 381 may be disposed on the planarization layer 270 to cover the first lower electrode 290, and the second transflective electrode layer 382 and the sixth transparent electrode layer 383 may be sequentially disposed on the fifth transparent electrode layer 381. The fifth transparent electrode layer 381 and the sixth transparent electrode layer 383 may be made of substantially the same material, and the second transflective electrode layer 382 may be interposed between the fifth transparent electrode layer 381 and the sixth transparent electrode layer 383. The fifth transparent electrode layer 381 may cover an uneven upper surface of the first lower electrode 290. Because the fifth transparent electrode layer 381 is disposed on the first lower electrode 290, the fifth transparent electrode layer 381 may assist in the formation of the second transflective electrode layer 382. The fifth transparent electrode layer 381 may be substantially transparent, and may transmit a light emitted from the first light emitting layer 330. Because the second transflective electrode layer 382 is disposed on the fifth transparent electrode layer 381, the second transflective electrode layer 382 may reflect at least a portion of a light emitted from the first light emitting layer 330 in the first direction D1. That is, the second transflective electrode layer 382, which is capable of transmitting a portion of a light and reflecting a remaining portion of a light, may serve as a transflective layer. The sixth transparent electrode layer 383 may be substantially transparent, and may transmit a light emitted from the first light emitting layer 330. The second transflective electrode layer 382 may include a metal, a metal alloy, metal nitride, conductive metal oxide, transparent conductive materials, etc. Each of the fifth transparent electrode layer 381 and the sixth transparent electrode layer 383 may include transparent conductive materials, etc.

The pixel defining layer 310 may be disposed on the planarization layer 270 to expose a portion of an upper surface of the protection member 380 and a portion of an upper surface of the second lower electrode 360. For example, the pixel defining layer 310 may cover both lateral portions of the protection member 380. In addition, the pixel defining layer 310 may cover side walls of the first opening of the planarization layer 270, and may cover both lateral portions of the second lower electrode 360. The pixel defining layer 310 may have a second opening that exposes a portion of the second lower electrode 360. The first light emitting layer 330 and the second light emitting layer 335 may be located in the protection member 380 where at least a portion is exposed by the pixel defining layer 310 and the second lower electrode 360 where at least a portion is exposed by the pixel defining layer 310, respectively. The pixel defining layer 310 may include organic materials or inorganic materials. In an exemplary embodiment, the pixel defining layer 310 may include organic materials.

The first light emitting layer 330 (e.g., a light emitting layer disposed in a first sub-pixel region 15 of FIG. 1) may be disposed on a portion where at least a portion of the protection member 380 is exposed. The first light emitting layer 330 may be formed using at least one of light emitting materials capable of generating different colors of light (e.g., a red color of a light, a blue color of a light, and a green color of a light, etc) according to first, second, and third sub-pixels of FIG. 1, and may emit the color of a light in the first direction D1. Alternatively, the first light emitting layer 330 may generally generate a white color of a light by stacking a plurality of light emitting materials capable of generating different colors of light, such as a red color of a light, a green color of a light, a blue color of a light, etc. In this case, a color filter may be disposed on the first light emitting layer 330. The color filter may include at least one selected from a red color filter, a green color filter, a blue color filter. Alternatively, the color filter may include a yellow color filter, cyan color filter, and magenta color filter. The color filter may include a photosensitive resin (or color photoresist), etc.

The second light emitting layer 335 (e.g., a light emitting layer disposed in a fourth sub-pixel region 30 of FIG. 1) may be disposed on a portion where at least a portion of the second lower electrode 360 is exposed. The second light emitting layer 335 may be formed using at least one of light emitting materials capable of generating different colors of light (e.g., a red color of a light, a blue color of a light, and a green color of a light, etc) according to fourth, fifth, and sixth sub-pixels of FIG. 1, and may emit the color of a light in the second direction D2. Alternatively, the second light emitting layer 335 may generally generate a white color of a light by stacking a plurality of light emitting materials capable of generating different colors of light such as a red color of a light, a green color of a light, a blue color of a light, etc. In this case, a color filter may be disposed under the second light emitting layer 335.

The first light emitting layer 330 and the second light emitting layer 335 may be controlled by the first semiconductor element 250. For example, when the first semiconductor element 250 is activated (e.g., turned-on), the OLED device 100 may show (e.g., display) display images that are the same in the first direction D1 and the second direction D2.

The upper electrode 340 may be disposed on the pixel defining layer 310 and the first and second light emitting layers 330 and 335. The upper electrode 340 may cover the pixel defining layer 310 and the first and second light emitting layers 330 and 335 in the first pixel region 10 and the second pixel region 50. That is, the upper electrode 340 may overlap the first and second light emitting layers 330 and 335. The upper electrode 340 may include a metal, a metal alloy, metal nitride, conductive metal oxide, transparent conductive materials, etc. These may be used alone or in a suitable combination thereof.

The reflection member 370 may be disposed in the second pixel region 50 on the upper electrode 340. The reflection member 370 may serve as a light reflection layer. The reflection member 370 may reflect a light emitted from the second light emitting layer 335 in the rear (e.g., the second direction D2). Thus, the reflection member 370 may be substantially opaque. The reflection member 370 may include a metal, a metal alloy, metal nitride, conductive metal oxide, etc.

The encapsulation substrate 350 may be disposed on the upper electrode 340 and the reflection member 370. The encapsulation substrate 350 and the substrate 110 may include substantially the same materials. For example, the encapsulation substrate 350 may include quartz, synthetic quartz, calcium fluoride, fluoride-doped quartz, sodalime glass, non-alkali glass etc. In some example embodiments, the encapsulation substrate 350 may include a transparent inorganic material or flexible plastic. For example, the encapsulation substrate 350 may include a flexible transparent resin substrate. In this case, to increase flexibility of the OLED device 100, the encapsulation substrate 350 may include a stacked structure in which at least one inorganic layer and at least one organic layer are alternately stacked.

Because the OLED device 100, in accordance with an exemplary embodiment, includes the protection member 380 covering the first lower electrode 290, the OLED device 100 may protect the first lower electrode 290 from an etchant used in a process for forming the second lower electrode 360. Accordingly, dark pixels may not be generated in the OLED device 100. In addition, because the second lower electrode 360 includes the first transflective electrode layer 362, the OLED device 100 may have a resonant structure including the second lower electrode 360 and the reflection member 370. Accordingly, the OLED device 100 may emit resonated light in the first and second directions D1 and D2.

FIGS. 5, 6, 7, 8, 9, 10, 11, and 12 are cross-sectional views illustrating a method of manufacturing an OLED device in accordance with an exemplary embodiment.

Referring to FIG. 5, a substrate 510 may be provided. The substrate 510 may be formed using a quartz substrate, a synthetic quartz substrate, a calcium fluoride substrate, a fluoride-doped quartz substrate, a sodalime glass substrate, a non-alkali glass substrate etc. Alternatively, a buffer layer (not shown) may be formed on the substrate 510. The buffer layer may extend in a third direction D3 on the substrate 510. The third direction D3 may be parallel to an upper surface of the substrate 510. That is, the buffer layer may be formed on the entire substrate 510, and may prevent the diffusion of metal atoms and/or impurities from the substrate 510.

An active layer 530 may be formed in the first pixel region 10 on the substrate 510. The active layer 530 may be formed using an oxide semiconductor, an inorganic semiconductor, an organic semiconductor, etc.

A gate insulation layer 550 may be formed on the substrate 510. The gate insulation layer 550 may cover the active layer 530, and may extend in the third direction D3 on the substrate 510. The gate insulation layer 550 may be formed in a first pixel region 10 and a second pixel region 50 on the entire substrate 510. The gate insulation layer 550 may include a silicon compound, a metal oxide, etc. For example, the gate insulation layer 550 may be formed using $SiO_x$, $SiN_x$, $SiO_xN_y$, $SiO_xC_y$, $SiC_xN_y$, $AlO_x$, $AlN_x$, $TaO_x$, $HfO_x$, $ZrO_x$, $TiO_x$, etc.

A first gate electrode 570 may be formed on a portion of the gate insulation layer 550 under which the active layer 530 is located to overlap the active layer 530 in a planar view. The first gate electrode 570 may include a metal, a metal alloy, metal nitride, conductive metal oxide, transparent conductive materials, etc. For example, the first gate electrode 570 may be formed using Au, Ag, Al, an alloy of aluminum, $AlN_x$, Ag, an alloy of silver, W, $WN_x$, Cu, an alloy of copper, Ni, Cr, $CrN_x$, Mo, an alloy of molybdenum, Ti, $TiN_x$, Pt, Ta, $TaN_x$, Nd, Sc, SRO, $ZnO_x$, $SnO_x$, $InO_x$, $GaO_x$, ITO, IZO, etc. These may be used alone or in a suitable combination thereof.

Referring to FIG. 6, a first insulating interlayer 590 may be formed on the first gate electrode 570. The first insulating interlayer 590 may cover the first gate electrode 570 in the first pixel region 10, and may extend in the third direction D3 on the gate insulation layer 550. That is, the first insulating interlayer 590 may be formed on the entire substrate 510. For example, the first insulating interlayer 590 may cover the first gate electrode 570, and may have a substantially even surface without a step around the first gate electrode 570. The first insulating interlayer 590 may be formed using a silicon compound, a metal oxide, etc.

A source electrode 610 and a drain electrode 630 may be formed on the first insulating interlayer 590. The source electrode 610 may be in contact with a first side of the active layer 530 via a contact hole formed by removing a portion of the gate insulation layer 550 and the first insulating interlayer 590 each. The drain electrode 630 may be in contact with a second side of the active layer 530 via a contact hole formed by removing a portion of the gate insulation layer 550 and the first insulating interlayer 590 each. Accordingly, a first semiconductor element 650 including the active layer 530, the first gate electrode 570, the source electrode 610, and the drain electrode 630 may be formed. Each of the source electrode 610 and the drain electrode 630 may be formed using a metal, a metal alloy, metal nitride, conductive metal oxide, transparent conductive materials, etc.

Referring to FIG. 7, a planarization layer 670 may be formed on the source electrode 610 and the drain electrode 630. The planarization layer 670 may extend in the third direction D3 on the first insulating interlayer 590, and a first opening may be formed therein exposing a portion of the first insulating interlayer 590 in the second pixel region 50. In addition, a contact hole that exposes an upper surface of the drain electrode 630 may be formed. For example, the planarization layer 670 may be formed with a relatively large thickness to cover the source and drain electrodes 610 and 630. In this case, the planarization layer 670 may have a substantially even upper surface, and a planarization process may be further performed on the planarization layer 670 to implement the even upper surface of the planarization layer 670. The planarization layer 670 may include organic materials or inorganic materials. In an exemplary embodiment, the planarization layer 670 may include organic materials. For example, the planarization layer 670 may be formed using a photoresist, a polyacryl-based resin, a polyimide-based resin, a polyamide-based resin, a siloxane-based resin, an acryl-based resin, an epoxy-based resin, etc.

Figure 8:
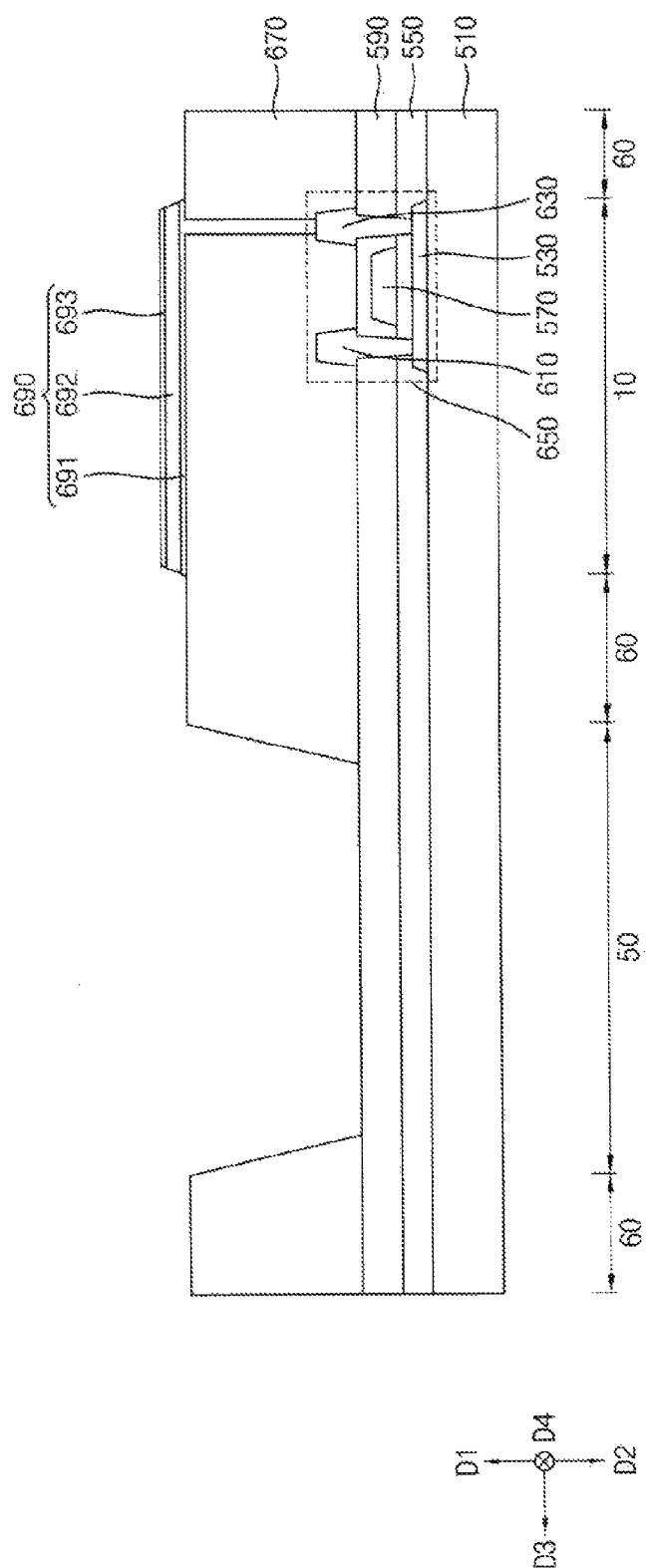

Referring to FIG. 8, a first lower electrode 690 may be formed in the first pixel region 10 on the planarization layer 670, and has a first thickness. For example, after a preliminary first lower electrode is entirely formed on the first insulating interlayer 590 and the planarization layer 670, the first lower electrode 690 of FIG. 8 may be formed by partially removing the preliminary first lower electrode. The first lower electrode 690 may be in contact with the drain electrode 630 via the contact hole. In addition, the first lower electrode 690 may be electrically connected to the first semiconductor element 650.

The first lower electrode 690 may have a multi-layered structure. The multi-layered structure may include the first transparent electrode layer 691, the reflection electrode layer 692, and the second transparent electrode layer 693. That is, the first transparent electrode layer 691 may be formed in the first pixel region 10 on the planarization layer 670, and the reflection electrode layer 692 and the second transparent electrode layer 693 may be sequentially formed on the first transparent electrode layer 691. For example, after a preliminary first transparent electrode layer, a preliminary reflection electrode layer, and a preliminary second transparent electrode layer are sequentially formed on the entire first insulating interlayer 590 and the entire planarization layer 670, the first transparent electrode layer 691, the reflection electrode layer 692, and the second transparent electrode layer 693 of FIG. 8 may be formed by partially removing the preliminary first transparent electrode layer, the preliminary reflection electrode layer, and the preliminary second transparent electrode layer. Here, the first transparent electrode layer 691 and the second transparent electrode layer 693 may include substantially the same material, and a thickness of the first and second transparent electrode layers 691 and 693 each may be substantially less than that of the reflection electrode layer 692, and a thickness of the first transparent electrode layer 691 may be substantially the same as that of the second transparent electrode layer 693.

The first transparent electrode layer 691 may cover an uneven upper surface of the planarization layer 670. As the first transparent electrode layer 691 is formed on the planarization layer 670, the first transparent electrode layer 691 may help the formation of the reflection electrode layer 692. As the second transparent electrode layer 693 is formed on the reflection electrode layer 692, a color coordinate of an OLED device may be readily controlled. The reflection electrode layer 692 may be formed as a relatively large thickness so as to reflect a light. Thus, the first lower electrode 690 including the reflection electrode layer 692 may be substantially opaque. The reflection electrode layer 692 may be formed using a metal, a metal alloy, metal nitride, conductive metal oxide, transparent conductive materials, etc. Each of the first transparent electrode layer 691 and the second transparent electrode layer 693 may be substantially transparent. For example, each of the first transparent electrode layer 691 and the second transparent electrode layer 693 may be formed using transparent conductive materials, etc.

Referring to FIG. 9, a preliminary second lower electrode 761 may be formed on the first insulating interlayer 590, the planarization layer 670, and the first lower electrode 690. That is, the preliminary second lower electrode 761 may be formed on the entire substrate 510. The preliminary second lower electrode 761 may have a multi-layered structure (refer to FIG. 4). For example, the preliminary second lower electrode 761 may include a preliminary third transparent electrode layer, a preliminary first transflective electrode layer, and a preliminary fourth transparent electrode layer. The preliminary third transparent electrode layer may be entirely formed on the first insulating interlayer 590, the planarization layer 670, and the first lower electrode 690, and the preliminary first transflective electrode layer may be formed on the entire preliminary third transparent electrode layer. In addition, the preliminary fourth transparent electrode layer may be formed on the entire preliminary first transflective electrode layer. Here, the preliminary third transparent electrode layer and the preliminary fourth transparent electrode layer may be formed using substantially the same material.

The preliminary third transparent electrode layer may cover an uneven upper surface of the first insulating interlayer 590 and uneven upper surface of the planarization layer 670. Because the preliminary third transparent electrode layer is formed on the first insulating interlayer 590 and the planarization layer 670, the preliminary third transparent electrode layer may help the formation of the preliminary first transflective electrode layer. The preliminary third transparent electrode layer may be substantially transparent, and may transmit a light. The preliminary first transflective electrode layer capable of transmitting a portion of a light and reflecting a remaining portion of a light may serve as a transflective layer. The preliminary fourth transparent electrode layer may be substantially transparent, and may transmit a light. The preliminary first transflective electrode layer may be formed using a metal, a metal alloy, metal nitride, conductive metal oxide, etc. Each of the preliminary third transparent electrode layer and the preliminary fourth transparent electrode layer may be formed using transparent conductive materials, etc.

Figure 10:
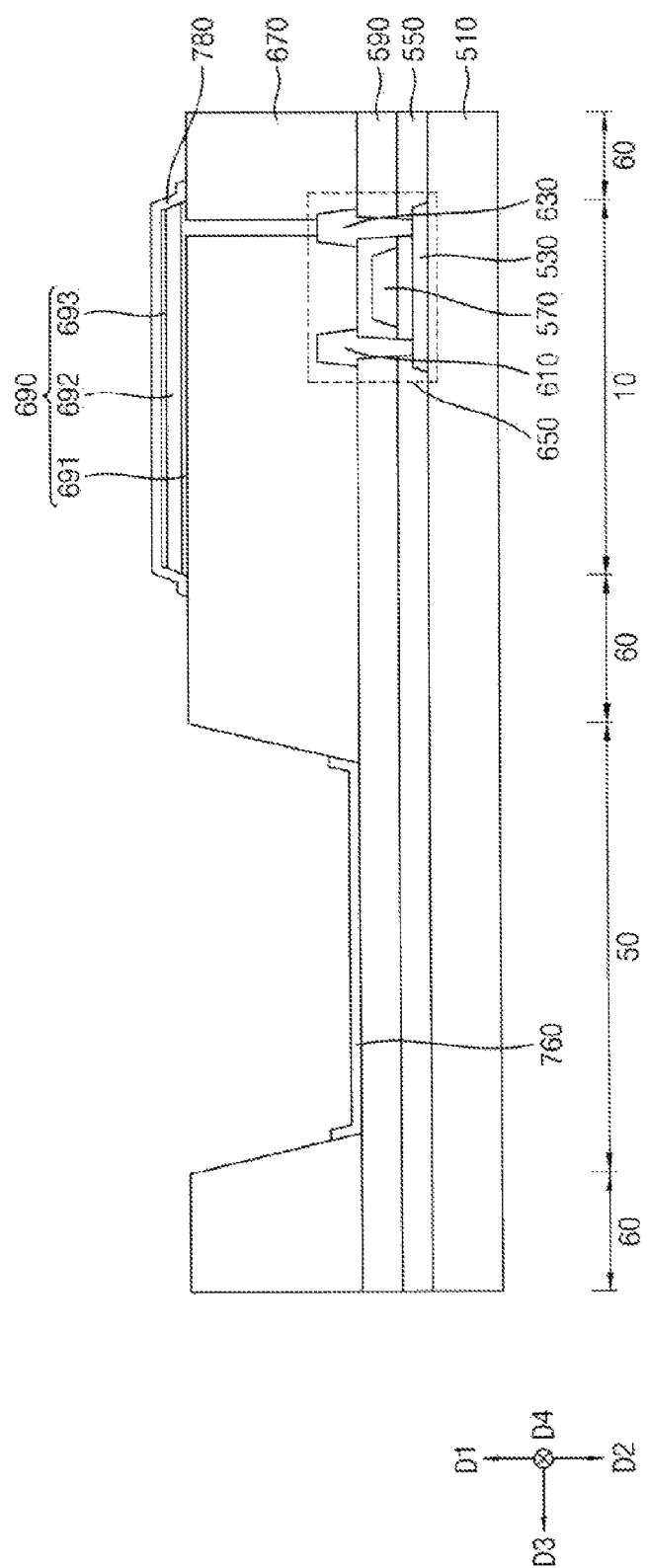

Referring to FIG. 10, after the preliminary second lower electrode 761 is formed on the first insulating interlayer 590, the planarization layer 670, and the first lower electrode 690, a second lower electrode 760 and a protection member 780, as illustrated in FIG. 10, may be simultaneously formed by partially removing the preliminary second lower electrode 761. That is, the second lower electrode 760 and the protection member 780 may be concurrently formed using the same material. The second lower electrode 760 may be formed in the second pixel region 50 on the planarization layer 670. For example, the second lower electrode 760 may be formed in the first opening of the planarization layer 670, and the second lower electrode 760, the source electrode 610, and the drain electrode 630 may be located at the same level.

The protection member 780 may be formed on the first lower electrode 690 and a portion of the planarization layer 670. In an exemplary embodiment, the protection member 780 may completely surround the first lower electrode 690 such that the first lower electrode 690 is not exposed. For example, a lower surface of the first lower electrode 690 may be in direct contact with an upper surface of the planarization layer 670, and an upper surface of the first lower electrode 690 may be in direct contact with a lower surface of the protection member 780. In addition, a portion of the protection member 780 may be in direct contact with an upper surface of the planarization layer 670. Because the protection member 780 completely covers the first lower electrode 690, the protection member 780 may protect the first lower electrode 690 from an etchant used in a process for forming the second lower electrode 760.

Referring to FIG. 11, a pixel defining layer 710 may be formed on the planarization layer 270 to expose a portion of an upper surface of the protection member 780 and a portion of an upper surface of the second lower electrode 760. For example, the pixel defining layer 710 may cover both lateral portions of the protection member 780. In addition, the pixel defining layer 710 may cover side walls of the first opening of the planarization layer 670, and may cover both lateral portions of the second lower electrode 760. Here, the pixel defining layer 710 may have a second opening that exposes a portion of the second lower electrode 760. The pixel defining layer 710 may be formed using organic materials or inorganic materials.

A first light emitting layer 730 may be formed on a portion in which at least a portion of the protection member 780 is exposed. The first light emitting layer 730 may be formed using at least one of light emitting materials capable of generating different colors of light (e.g., a red color of a light, a blue color of a light, and a green color of a light, etc) according to first, second, and third sub-pixels of FIG. 1. Alternatively, the first light emitting layer 730 may generally generate a white color of a light by stacking a plurality of light emitting materials capable of generating different colors of light, such as a red color of a light, a green color of a light, a blue color of a light, etc.

A second light emitting layer 735 may be formed on a portion where at least a portion of the second lower electrode 760 is exposed. The second light emitting layer 735 may be formed using at least one of light emitting materials capable of generating different colors of light (e.g., a red color of a light, a blue color of a light, and a green color of a light, etc) according to fourth, fifth, and sixth sub-pixels of FIG. 1. Alternatively, the second light emitting layer 735 may generally generate a white color of a light by stacking a plurality of light emitting materials capable of generating different colors of light such as a red color of a light, a green color of a light, a blue color of a light, etc.

An upper electrode 740 may be formed on the pixel defining layer 710 and the first and second light emitting layers 730 and 735. The upper electrode 740 may cover the pixel defining layer 710 and the first and second light emitting layers 730 and 735 in the first pixel region 10 and the second pixel region 50. That is, the upper electrode 740 may overlap the first and second light emitting layers 730 and 735. The upper electrode 740 may be formed using a metal, a metal alloy, metal nitride, conductive metal oxide, transparent conductive materials, etc. These may be used alone or in a suitable combination thereof.

Figure 12:
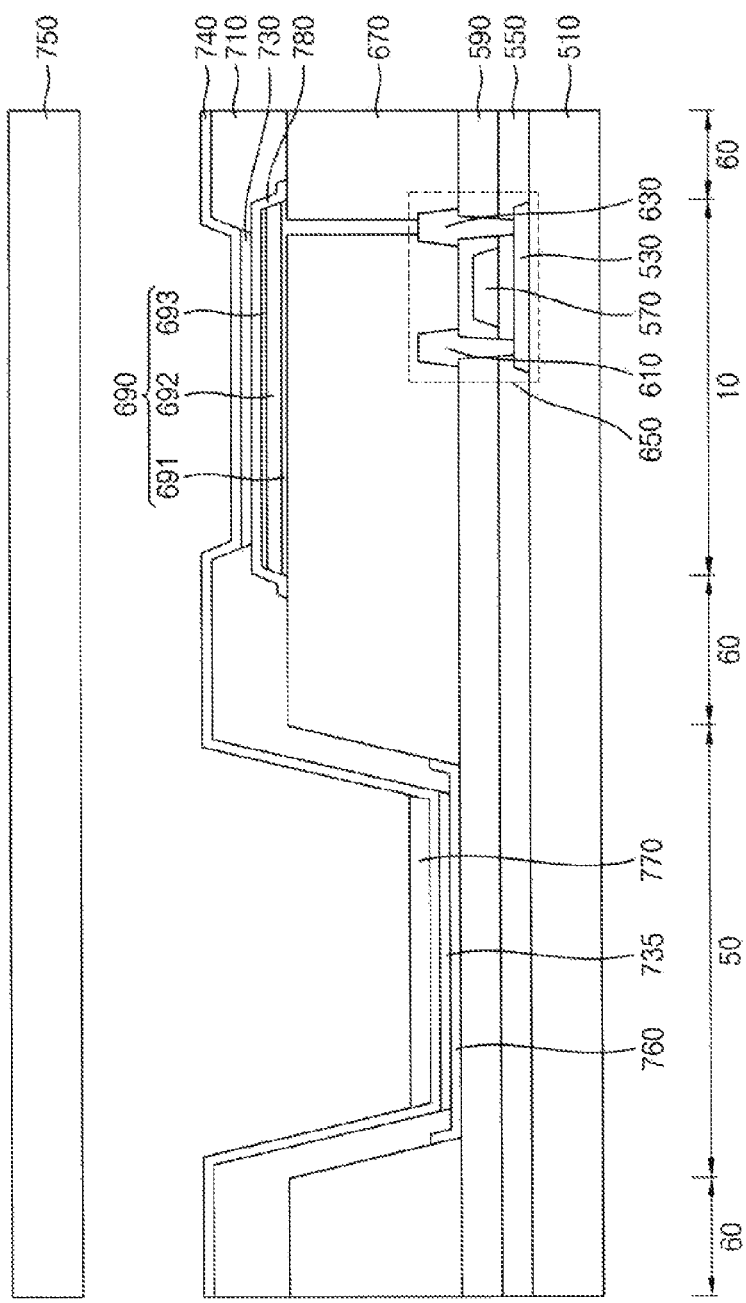

Referring to FIG. 12, a reflection member 770 may be formed in the second pixel region 50 on the upper electrode 740. The reflection member 770 may serve as a light reflection layer. The reflection member 770 may reflect a light emitted from the second light emitting layer 735 in the rear (e.g., a second direction D2). Thus, the reflection member 770 may be substantially opaque. The reflection member 770 may be formed using a metal, a metal alloy, metal nitride, conductive metal oxide, etc.

An encapsulation substrate 750 may be formed on the upper electrode 740 and the reflection member 770. The encapsulation substrate 750 and the substrate 510 may include substantially the same materials. For example, the encapsulation substrate 750 may be formed using quartz, synthetic quartz, calcium fluoride, fluoride-doped quartz, sodalime glass, non-alkali glass etc. The encapsulation substrate 750 may be combined with the substrate 510 in the upper electrode 740 by performing an encapsulation process. Accordingly, an OLED device 100 illustrated in FIG. 2 may be manufactured.

FIG. 13 is a cross-sectional view illustrating an OLED device in accordance with another exemplary embodiment. An OLED device illustrated in FIG. 13 may have a configuration substantially the same as or similar to that of an OLED device 100 described with reference to FIG. 2, except for the presence of a first lower electrode 295. In FIG. 13, detailed descriptions for elements that are substantially the same as or similar to elements described with reference to FIG. 2 may not be repeated.

Referring to FIG. 13, an OLED device may include a substrate 110, a gate insulation layer 150, a first semiconductor element 250, a first insulating interlayer 190, a planarization layer 270, a first lower electrode 295, a protection member 380, a pixel defining layer 310, a second lower electrode 360, a first light emitting layer 330, a second light emitting layer 335, an upper electrode 340, a reflection member 370, an encapsulation substrate 350, etc. Here, the first semiconductor element 250 may include an active layer 130, a first gate electrode 170, a source electrode 210, and a drain electrode 230. In addition, the second lower electrode 360 may include a third transparent electrode layer 361, a first transflective electrode layer 362, and a fourth transparent electrode layer 363. The protection member 380 may include a fifth transparent electrode layer 381, a second transflective electrode layer 382, and a sixth transparent electrode layer 383. The first lower electrode 295 may have a first thickness, and the second lower electrode 360 may have a second thickness that is less than the first thickness.

The first lower electrode 295 may be disposed in the first pixel region 10 on the planarization layer 270, and may have the first thickness that is greater than the second thickness of the second lower electrode 360. For example, the first lower electrode 295 may have a large thickness such that a light emitted from the first light emitting layer 330 is reflected in a first direction D1. The first lower electrode 295 may be in contact with the drain electrode 230 by perforating a contact hole of the planarization layer 270. In addition, the first lower electrode 295 may be electrically connected to the first semiconductor element 250. The OLED device 100 in the first pixel region 10 may display a display image in the first direction D1. Thus, the first lower electrode 295 may serve as the light reflection layer. In an exemplary embodiment, the protection member 380 may include the fifth transparent electrode layer 381, the second transflective electrode layer 382, and the sixth transparent electrode layer 383. Because the first lower electrode 295 is formed as a single layer, a color coordinate of the OLED device may be controlled using the protection member 380.

Figure 14:
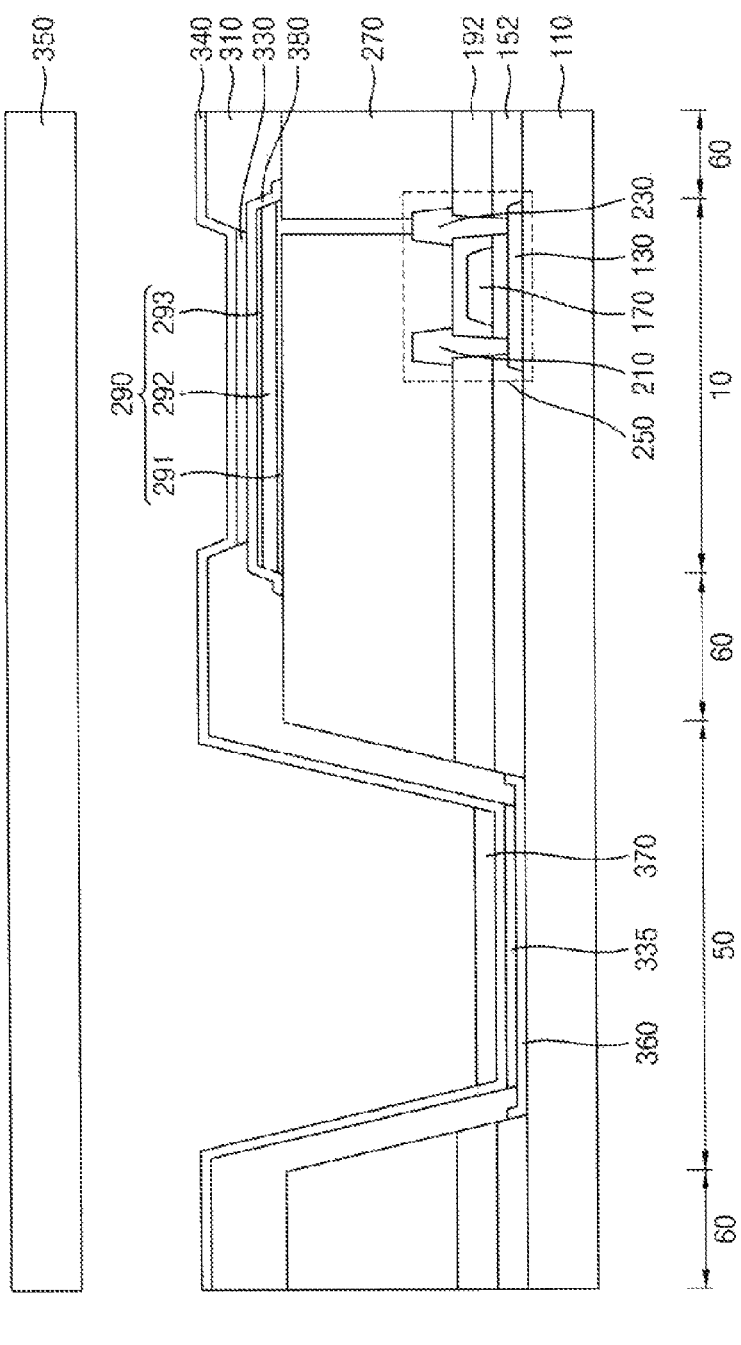
FIG. 14 is a cross-sectional view illustrating an OLED device in accordance with an exemplary embodiment.

FIG. 14 is a cross-sectional view illustrating an OLED device in accordance with another exemplary embodiment. An OLED device illustrated in FIG. 14 may have a configuration substantially the same as or similar to that of an OLED device 100 described with reference to FIG. 2 except for the presence of a gate insulation layer 152 and a first insulating interlayer 192. In FIG. 14, detailed descriptions for elements that are substantially the same as or similar to elements described with reference to FIG. 2 may not be repeated.

Referring to FIG. 14, an OLED device 100 may include a substrate 110, a gate insulation layer 152, a first semiconductor element 250, a first insulating interlayer 192, a planarization layer 270, a first lower electrode 290, a protection member 380, a pixel defining layer 310, a second lower electrode 360, a first light emitting layer 330, a second light emitting layer 335, an upper electrode 340, a reflection member 370, an encapsulation substrate 350, etc. Here, the first semiconductor element 250 may include an active layer 130, a first gate electrode 170, a source electrode 210, and a drain electrode 230. In addition, the first lower electrode 290 may include a first transparent electrode layer 291, a reflection electrode layer 292, and a second transparent electrode layer 293, and the second lower electrode 360 may include a third transparent electrode layer 361, a first transflective electrode layer 362, and a fourth transparent electrode layer 363. The protection member 380 may include a fifth transparent electrode layer 381, a second transflective electrode layer 382, and a sixth transparent electrode layer 383. The first lower electrode 290 may have a first thickness, and the second lower electrode 360 may have a second thickness that is less than the first thickness.

The gate insulation layer 152 may be disposed on the active layer 130. The gate insulation layer 152 may extend in a third direction D3 on the substrate 110. The third direction D3 may be parallel to an upper surface of the substrate 110, or may be from the first pixel region 10 to the second pixel region 50. In an exemplary embodiment, the gate insulation layer 152 may cover the active layer 130 in the first pixel region 10, and may expose the second pixel region 50 on the substrate 110. That is, the gate insulation layer 152 may have a first opening that exposes a portion of the substrate 110.

The first insulating interlayer 192 may be disposed on the first gate electrode 170. The first insulating interlayer 192 may cover the first gate electrode 170 in the first pixel region 10, and may extend in the third direction D3 on the gate insulation layer 152. In an exemplary embodiment, the first insulating interlayer 192 may expose the second pixel region 50 on the substrate 110. The first insulating interlayer 192 may have a second opening that exposes a portion of the substrate 110 exposed via the first opening.

The planarization layer 270 may be disposed on the source electrode 210 and the drain electrode 230. The planarization layer 270 may extend in the third direction D3 on the first insulating interlayer 192, and may have a third opening that exposes a portion of the substrate via the first and second openings in the second pixel region 50. For example, the planarization layer 270 may be disposed to have a relatively large thickness to cover the source and drain electrodes 210 and 230. In this case, the planarization layer 270 may have a substantially even upper surface, and a planarization process may be further performed on the planarization layer 270 to implement the even upper surface of the planarization layer 270. Alternatively, the planarization layer 270 may cover the source and drain electrodes 210 and 230, and may be disposed as a substantially uniform thickness along a profile of the source and drain electrodes 210 and 230. The planarization layer 270 may include organic materials or inorganic materials. In an exemplary embodiment, the planarization layer 270 may include organic materials. For example, the planarization layer 270 may include a photoresist, a polyacryl-based resin, a polyimide-based resin, a polyamide-based resin, a siloxane-based resin, an acryl-based resin, an epoxy-based resin, etc.

The second lower electrode 360 may be disposed in the second pixel region 50 on the substrate 110. For example, the second lower electrode 360 may be disposed in the first opening of the gate insulation layer 152, and the second lower electrode 360 and the active layer 130 may be located at the same level.

The pixel defining layer 310 may be disposed on the planarization layer 270 to expose a portion of an upper surface of the protection member 380 and a portion of an upper surface of the second lower electrode 360. For example, the pixel defining layer 310 may cover both lateral portions of the protection member 380. In addition, the pixel defining layer 310 may cover side walls of the first opening of the gate insulation layer 152, side walls of the second opening of the first insulating interlayer 192, and side walls of the third opening of the planarization layer 270, and may cover both lateral portions of the second lower electrode 360.

Accordingly, when a light is emitted from the second light emitting layer 335 in a second direction D2, a display image of the second direction D2 of the OLED device may be improved because the light does not transmit through the first insulating interlayer 192 and the gate insulation layer 152.

Figure 15:
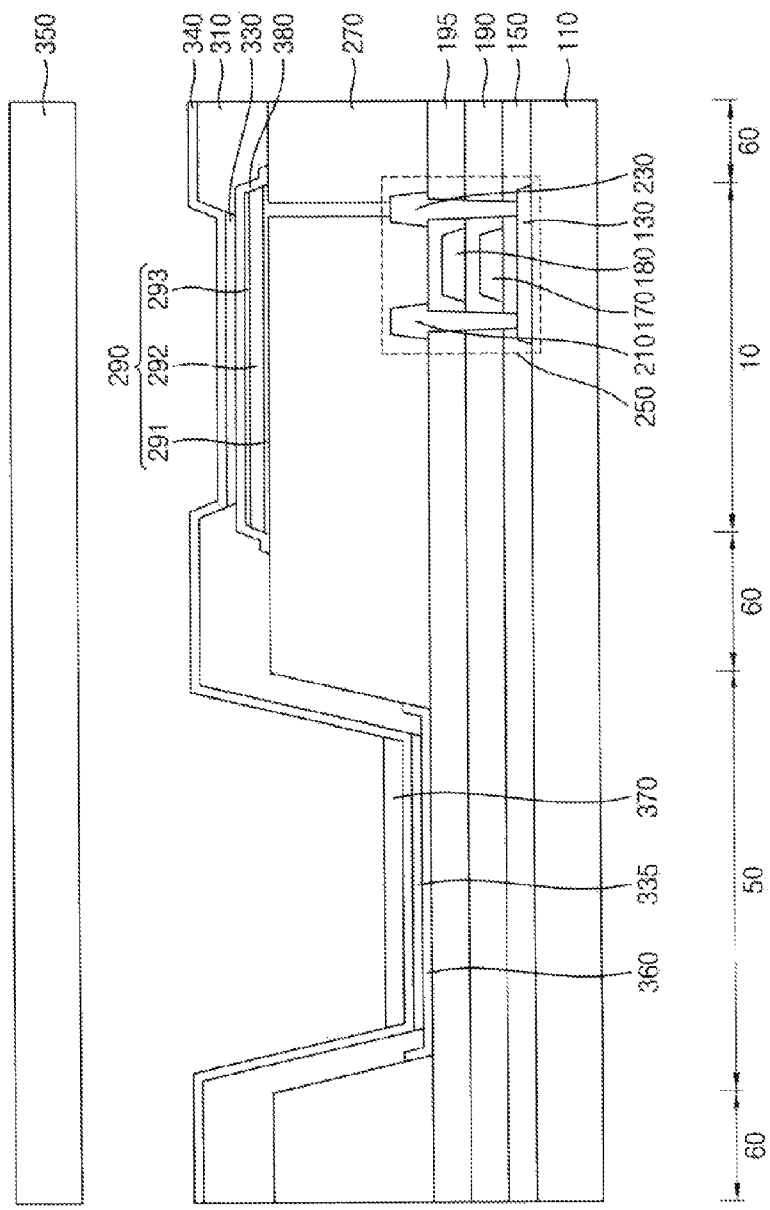
FIG. 15 is a cross-sectional view illustrating an OLED device in accordance with an exemplary embodiment.

FIG. 15 is a cross-sectional view illustrating an OLED device in accordance with another exemplary embodiment. An OLED device illustrated in FIG. 15 may have a configuration substantially the same as or similar to that of an OLED device 100 described with reference to FIG. 2 except for the presence of a second insulating interlayer 195 and a second gate electrode 180. In FIG. 15, detailed descriptions for elements that are substantially the same as or similar to elements described with reference to FIG. 2 may not be repeated.

Referring to FIG. 15, an OLED device may include a substrate 110, a gate insulation layer 150, a first semiconductor element 250, a first insulating interlayer 190, a second insulating interlayer 195, a planarization layer 270, a first lower electrode 290, a protection member 380, a pixel defining layer 310, a second lower electrode 360, a first light emitting layer 330, a second light emitting layer 335, an upper electrode 340, a reflection member 370, an encapsulation substrate 350, etc. Here, the first semiconductor element 250 may include an active layer 130, a first gate electrode 170, a second gate electrode 180, a source electrode 210, and a drain electrode 230. In addition, the first lower electrode 290 may include a first transparent electrode layer 291, a reflection electrode layer 292, and a second transparent electrode layer 293, and the second lower electrode 360 may include a third transparent electrode layer 361, a first transflective electrode layer 362, and a fourth transparent electrode layer 363. Further, the protection member 380 may include a fifth transparent electrode layer 381, a second transflective electrode layer 382, and a sixth transparent electrode layer 383. The first lower electrode 290 may have a first thickness, and the second lower electrode 360 may have a second thickness that is less than the first thickness.

The second gate electrode 180 may be disposed in the first pixel region 10 on the first insulating interlayer 190. The second gate electrode 180 may be located on a portion of the first insulating interlayer 190 under which the first gate electrode 170 is disposed to overlap the first gate electrode 170 in a planar view. The second gate electrode 180 may include a metal, a metal alloy, metal nitride, conductive metal oxide, transparent conductive materials, etc. In example embodiments, the first gate electrode 170 and the second gate electrode 180 may serve as a capacitor.

The second insulating interlayer 195 may be disposed on the second gate electrode 180. The second insulating interlayer 195 may cover the second gate electrode 180 in the first pixel region 10, and may extend in a third direction D3 on the first insulating interlayer 190. That is, the second insulating interlayer 195 may be disposed on the entire substrate 110. For example, the second insulating interlayer 195 may cover the second gate electrode 180, and may have a substantially even surface without a step around the second gate electrode 180. Alternatively, the second insulating interlayer 195 may cover the second gate electrode 180, and may be disposed as a substantially uniform thickness along a profile of the second gate electrode 180. The second insulating interlayer 195 may include a silicon compound, a metal oxide, etc.

FIG. 16 is a cross-sectional view illustrating an OLED device in accordance with another exemplary embodiment. An OLED device illustrated in FIG. 16 may have a configuration substantially the same as or similar to that of an OLED device 100 described with reference to FIG. 15, except for the presence of a second semiconductor element 255. In FIG. 16, detailed descriptions for elements that are substantially the same as or similar to elements described with reference to FIG. 15 may not be repeated.

Referring to FIG. 16, an OLED device may include a substrate 110, a gate insulation layer 150, a first semiconductor element 250, a second semiconductor element 255, a first insulating interlayer 190, a second insulating interlayer 195, a planarization layer 270, a first lower electrode 290, a protection member 380, a pixel defining layer 310, a second lower electrode 360, a first light emitting layer 330, a second light emitting layer 335, an upper electrode 340, a reflection member 370, an encapsulation substrate 350, etc. Here, the first semiconductor element 250 may include an active layer 130, a first gate electrode 170, a second gate electrode 180, a source electrode 210, and a drain electrode 230, and the second semiconductor element 255 may include an active layer 135, a first gate electrode 175, a second gate electrode 185, a source electrode 215, and a drain electrode 235. In addition, the first lower electrode 290 may include a first transparent electrode layer 291, a reflection electrode layer 292, and a second transparent electrode layer 293, and the second lower electrode 360 may include a third transparent electrode layer 361, a first transflective electrode layer 362, and a fourth transparent electrode layer 363. The protection member 380 may include a fifth transparent electrode layer 381, a second transflective electrode layer 382, and a sixth transparent electrode layer 383. The first lower electrode 290 may have a first thickness, and the second lower electrode 360 may have a second thickness that is less than the first thickness.

In an exemplary embodiment, the first semiconductor element 250 and the second semiconductor element 255 may be spaced apart from each other on the substrate 110. The second semiconductor element 255 may be electrically connected to the second lower electrode 360, and the first semiconductor element 250 may be electrically connected to the first lower electrode 290. Because the OLED device includes the second semiconductor element 255, the second light emitting layer 335 may emit light independently. That is, when the first semiconductor element 250 and the second semiconductor element 255 are activated, the OLED device may show (or display) display images that are different from each other in first and second directions D1 and D2.

The present invention may be applied to various display devices, including an organic light emitting display device. For example, the present invention may be applied to vehicle-display device, a ship-display device, an aircraft-display device, portable communication devices, display devices for display or for information transfer, a medical-display device, etc.

Although certain exemplary embodiments and implementations have been described herein, other embodiments and modifications will be apparent from this description.

Accordingly, the inventive concept is not limited to such embodiments, but rather to the broader scope of the presented claims and various obvious modifications and equivalent arrangements.

What is claimed is:

1. An organic light emitting display (OLED) device, comprising:
   a substrate comprising:
      a first pixel region in which a light is emitted in a first direction; and
      a second pixel region in which a light is emitted in a second direction that is opposite to the first direction, the second pixel region being located adjacent to the first pixel region;
   a first semiconductor element disposed in the first pixel region on the substrate, the first semiconductor element comprising:
      an active layer disposed on the substrate;
      a first gate electrode disposed on the active layer; and
      source and drain electrodes disposed on the first gate electrode;
   a first lower electrode disposed in the first pixel region on the first semiconductor element, the first lower electrode having a first thickness;
   a protection member covering the first lower electrode;
   a first light emitting layer disposed in the first pixel region on the protection member;
   a second lower electrode disposed in the second pixel region on the substrate, the second lower electrode having a second thickness that is less than the first thickness;
   a second light emitting layer disposed in the second pixel region on the second lower electrode;
   an upper electrode disposed on the first and second light emitting layers;
   a planarization layer covering the source and drain electrodes, the planarization layer comprising a first opening located in the second pixel region;
   a pixel defining layer exposing a portion of an upper surface of the protection member in the first pixel region on the planarization layer, the pixel defining layer covering side walls of the first opening in the second pixel region and having a second opening exposing a portion of an upper surface of the second lower electrode; and
   a reflection member disposed in the second opening.

2. The OLED device of claim 1, wherein:
   the reflection member is disposed in the second pixel region on the upper electrode and overlaps the second light emitting layer; and
   the reflection member is configured to reflect a light emitted from the second light emitting layer in the second direction.

3. The OLED device of claim 1, wherein a thickness of the second lower electrode is the same as a thickness of the protection member.

4. The OLED device of claim 1, wherein the first lower electrode is configured to reflect a light emitted from the first light emitting layer in the first direction, and the second lower electrode is configured to transmit a light emitted from the second light emitting layer in the second direction.

5. The OLED device of claim 1, wherein the first lower electrode comprises:
   a first transparent electrode layer;
   a reflection electrode layer disposed on the first transparent electrode layer, the reflection electrode configured to reflecting a light emitted from the first light emitting layer in the first direction; and
   a second transparent electrode layer disposed on the reflection electrode.

6. The OLED device of claim 5, wherein the second lower electrode comprises:
   a third transparent electrode layer;
   a first transflective electrode layer disposed on the third transparent electrode layer, the first transflective electrode layer configured to reflect at least a portion of a light emitted from the second light emitting layer in the first direction; and
   a fourth transparent electrode layer disposed on the first transflective electrode layer.

7. The OLED device of claim 6, wherein the OLED device comprises a resonant structure in the first and second pixel regions.

8. The OLED device of claim 6, wherein the protection member comprises a multi-layered structure comprising a plurality of conductive layers.

9. The OLED device of claim 6, wherein the protection member comprises:
   a fifth transparent electrode layer;
   a second transflective electrode layer disposed on the fifth transparent electrode layer, the second transflective electrode layer configured to reflect at least a portion of a light emitted from the first light emitting layer in the first direction; and
   a sixth transparent electrode layer disposed on the second transflective electrode layer.

10. The OLED device of claim 9, wherein the protection member and the second lower electrode are simultaneously formed using the same material.

11. The OLED device of claim 1, further comprising:
   a gate insulation layer covering the active layer on the substrate and extending in a third direction that is parallel to an upper surface of the substrate; and
   a first insulating interlayer covering the first gate electrode on the gate insulation layer and extending in the third direction,
   wherein:
   the planarization layer is disposed on the first insulating interlayer and extends in the third direction, and the first opening exposes a portion of the first insulating interlayer in the second pixel region; and
   the second lower electrode is disposed in the first opening on the first insulating interlayer, and the source and drain electrodes and the second lower electrode are located at the same level.

12. The OLED device of claim 11, further comprising:
   a second gate electrode disposed on the first insulating interlayer under which the first gate electrode is located; and
   a second insulating interlayer covering the second gate electrode on the first insulating interlayer and extending in the third direction.

13. The OLED device of claim 1, further comprising a second semiconductor element spaced apart from the first semiconductor element on the substrate,
   wherein:
   the first semiconductor element is electrically connected to the first lower electrode, and the second semiconductor element is electrically connected to the second lower electrode; and when the first and second semiconductor elements are activated, the OLED device displays display images that are different from each other in the first and second directions.

14. The OLED device of claim 11, wherein a lower surface of the first lower electrode is in contact with an upper surface of the planarization layer, and a portion of the protection member is in contact with the upper surface of the planarization layer.

15. The OLED device of claim 1, wherein:
the first semiconductor element is electrically connected to the first lower electrode and the second lower electrode; and
when the first semiconductor element is activated, the OLED device is configured to display images that are the same in the first and second directions.

16. An organic light emitting display (OLED) device, comprising:
a substrate comprising:
a first pixel region in which a light is emitted in a first direction; and
a second pixel region in which a light is emitted in a second direction that is opposite to the first direction, the second pixel region being located adjacent to the first pixel region;
a first semiconductor element disposed in the first pixel region on the substrate, the first semiconductor element comprising:
an active layer disposed on the substrate;
a first gate electrode disposed on the active layer; and
source and drain electrodes disposed on the first gate electrode;
a first lower electrode disposed in the first pixel region on the first semiconductor element, the first lower electrode having a first thickness;
a protection member covering the first lower electrode;
a first light emitting layer disposed in the first pixel region on the protection member;
a second lower electrode disposed in the second pixel region on the substrate, the second lower electrode having a second thickness that is less than the first thickness;
a second light emitting layer disposed in the second pixel region on the second lower electrode;
an upper electrode disposed on the first and second light emitting layers;
a gate insulation layer covering the active layer on the substrate and extending in a third direction that is parallel to an upper surface of the substrate, the gate insulation layer comprising a first opening exposing a portion of the substrate in the second pixel region;
a first insulating interlayer covering the first gate electrode on the gate insulation layer and extending in the third direction, the first insulating interlayer comprising a second opening exposing a portion of the substrate exposed via the first opening; and
a planarization layer covering the source and drain electrodes on the first insulating interlayer and extending in the third direction, the planarization layer comprising a third opening exposing a portion of the substrate exposed via the first and second openings in the second pixel region,
wherein the second lower electrode is disposed in the first opening on the substrate, and the active layer and the second lower electrode are located at the same level.

17. The OLED device of claim 16, further comprising:
a pixel defining layer exposing at least a portion of the protection member in the first pixel region on the planarization layer, the pixel defining layer covering side walls of the first opening in the second pixel region and having a fourth opening exposing at least a portion of the second lower electrode; and
a reflection member disposed in the fourth opening.

18. The OLED device of claim 16, wherein a lower surface of the first lower electrode is in contact with an upper surface of the planarization layer, and a portion of the protection member is in contact with the upper surface of the planarization layer.

* * * * *